(12) United States Patent
Mori et al.

(10) Patent No.: US 10,910,511 B2
(45) Date of Patent: Feb. 2, 2021

(54) MANUFACTURING METHOD OF III-V COMPOUND CRYSTAL AND MANUFACTURING METHOD OF SEMICONDUCTOR DEVICE

(71) Applicants: DISCO CORPORATION, Tokyo (JP); OSAKA UNIVERSITY, Suita (JP)

(72) Inventors: Yusuke Mori, Suita (JP); Masashi Yoshimura, Suita (JP); Mamoru Imade, Suita (JP); Masayuki Imanishi, Suita (JP); Hiroshi Morikazu, Tokyo (JP); Shin Tabata, Tokyo (JP); Takumi Shotokuji, Toda (JP)

(73) Assignees: OSAKA UNIVERSITY, Osaka (JP); DISCO CORPORATION, Tokyo (JP)

( * ) Notice: Subject to any disclaimer, the term of this patent is extended or adjusted under 35 U.S.C. 154(b) by 0 days.

(21) Appl. No.: 16/135,679

(22) Filed: Sep. 19, 2018

(65) Prior Publication Data

US 2019/0088816 A1 Mar. 21, 2019

(30) Foreign Application Priority Data

Sep. 21, 2017 (JP) ................... 2017-181815

(51) Int. Cl.
*H01L 33/18* (2010.01)
*H01L 33/00* (2010.01)
(Continued)

(52) U.S. Cl.
CPC .......... *H01L 33/0066* (2013.01); *C30B 19/02* (2013.01); *C30B 25/02* (2013.01); *C30B 29/406* (2013.01); *C30B 33/06* (2013.01); *H01L 33/007* (2013.01); *H01L 33/0093* (2020.05); *H01L 33/18* (2013.01); *H01L 33/32* (2013.01); *H01L 33/025* (2013.01)

(58) Field of Classification Search
None
See application file for complete search history.

(56) References Cited

U.S. PATENT DOCUMENTS

| 2006/0148186 A1* | 7/2006 | Lee ...................... C30B 29/406 |
| | | 438/308 |
| 2013/0015560 A1* | 1/2013 | Pimputkar ............. C30B 17/00 |
| | | 257/615 |
| 2017/0263810 A1* | 9/2017 | Imai ......................... C30B 9/00 |

FOREIGN PATENT DOCUMENTS

| JP | 63178516 A | 7/1988 |
| JP | 2006008416 A | 1/2006 |

(Continued)

OTHER PUBLICATIONS

Google english translation of JP-2006188409-A (Year: 2006).*

*Primary Examiner* — Bradley Smith
(74) *Attorney, Agent, or Firm* — Greer Burns & Crain Ltd.

(57) ABSTRACT

There is provided a manufacturing method of a III-V compound crystal including a seed-crystal-formed substrate provision step of providing a seed-crystal-formed substrate in which a III-V compound seed crystal has been formed on a substrate, a seed crystal partial separation step of separating part of a portion in contact with the substrate in the III-V compound seed crystal from the substrate, and a crystal growth step of generating and growing the III-V compound crystal by reacting a group III element and a group V element with use of the III-V compound seed crystal as a nucleus after the seed crystal partial separation step.

17 Claims, 12 Drawing Sheets

(51) Int. Cl.
*C30B 25/02* (2006.01)
*C30B 19/02* (2006.01)
*C30B 33/06* (2006.01)
*C30B 29/40* (2006.01)
*H01L 33/32* (2010.01)
*H01L 33/02* (2010.01)

(56) References Cited

FOREIGN PATENT DOCUMENTS

| | | | | | |
|---|---|---|---|---|---|
| JP | 2006188409 | A | * | 7/2006 | ........... C30B 29/406 |
| JP | 4422473 | B2 | | 2/2010 | |
| JP | 4588340 | B2 | | 12/2010 | |
| JP | 2014009156 | A | | 1/2014 | |

* cited by examiner

FIG.7A
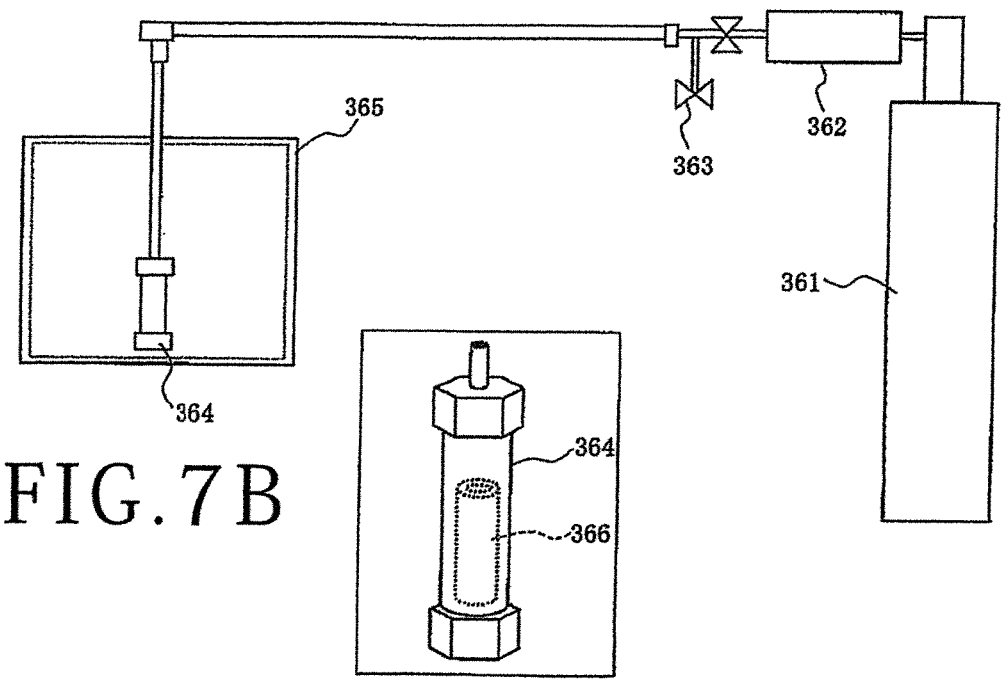
FIG.7B
FIG.8
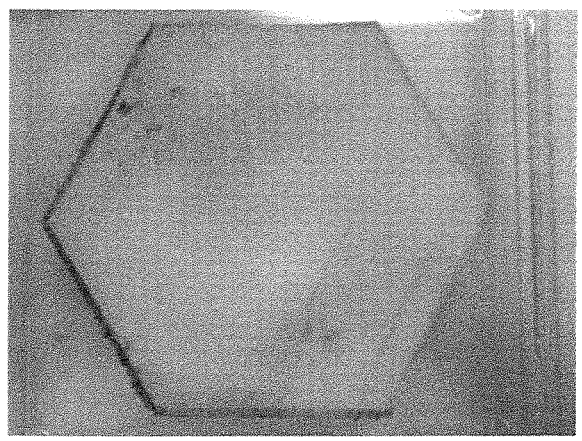
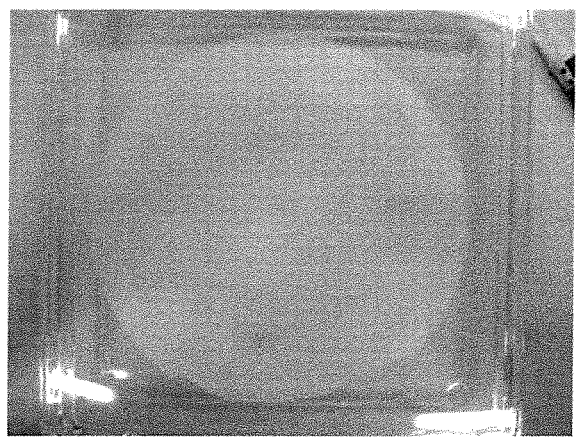

| CULTIVATION CONDITION | CULTIVATION TEMPERATURE[℃] | 870 |
|---|---|---|
| | PRESSURE[MPa] | 4.0 |
| | TIME[h] | 72 |
| | Ga : Na RATIO[MPa] | 27:73 |
| | C AMOUNT[mol%] | 0.5 |
| | LIQUID LEVEL[cm] | 0.8 |
| ■ | CRUCIBLE TYPE | ALUMINA |
| | SEED GaN FILM THICKNESS | 5um |

| | Ref. | LAS PATTERN PROCESSING |
|---|---|---|
| FRONT SURFACE |  |  |
| BACK SURFACE |  |  |
| YIELD(%) | 32.4 | 23.2 |
| FILM THICKNESS(mm) | 0.48 | 0.50 |

- SAPPHIRE WAS NOT PEELED OFF
- CRACK EXISTED IN SAPPHIRE

MANUFACTURING METHOD OF III-V COMPOUND CRYSTAL AND MANUFACTURING METHOD OF SEMICONDUCTOR DEVICE

BACKGROUND OF THE INVENTION

Field of the Invention

The present invention relates to a manufacturing method of a III-V compound crystal and a manufacturing method of semiconductor device.

Description of the Related Art

III-V compound semiconductors (referred to also as III-V semiconductors, GaN-based semiconductors, or the like) such as gallium nitride (GaN) are widely used as materials of various kinds of semiconductor elements such as laser diode (LD) and light-emitting diode (LED).

As a method for easily manufacturing a III-V compound semiconductor, a vapor phase epitaxial growth method (often referred to simply as "vapor phase growth method") is used, for example (Japanese Patent Examined Publication No. H7-54806 and Japanese Patent Laid-open No. 2014-009156). In the vapor phase epitaxial growth method, there was a limit to the thickness of the crystal that grows. However, due to improvements in recent years, it has become possible to obtain III-V compound crystals having a large thickness. As the vapor phase growth method, there are hydride vapor phase growth method (hydride vapor phase epitaxy (HVPE)), metal organic vapor phase growth method (referred to also as metal organic chemical vapor deposition (MOCVD) or metal organic vapor phase epitaxy (MOVPE)), and so forth. In Japanese Patent Examined Publication No. H7-54806 and Japanese Patent Laid-open No. 2014-009156, a buffer layer (stress alleviating layer) is formed on a sapphire substrate and a gallium nitride layer is further formed thereon by a vapor phase growth method.

Furthermore, as a manufacturing method of a III-V compound crystal, a liquid phase growth method (liquid phase epitaxy (LPE) in which a crystal is grown in a liquid phase is also used. This liquid phase growth method had a problem that high temperature and high pressure are necessary. However, due to improvements in recent years, it has become possible to carry out the liquid phase growth method at comparatively low temperature and pressure and this method has becomes a method suitable also for mass production (Japanese Patent No. 4920875). The liquid phase growth method (LPE)) may be a method in which a III-V compound crystal layer serving as a seed crystal is deposited on a substrate by MOCVD and thereafter the III-V compound crystal is further grown by a liquid phase growth method, for example (Japanese Patent No. 4920875).

SUMMARY OF THE INVENTION

To separate (peel off) a manufactured III-V compound crystal from a substrate, the following method can be used, for example. Specifically, irradiation with a laser beam transmitted through a substrate is carried out from the substrate side and the laser beam is focused at a buffer layer to form a peeling layer. Thereafter, an external force is given to peel off the substrate from the III-V compound crystal.

However, this method has the following problems. First, the III-V compound crystal is grown on the substrate at a high temperature of 800° C. to 1200° C. or the like in a furnace, for example. Thereafter, to process the III-V compound crystal and the substrate by laser beam irradiation, they need to be taken out from the furnace. At this time, the III-V compound crystal and the substrate are cooled to a room temperature, for example. At the time of the cooling, possibly the III-V compound crystal and the substrate get distorted to bend due to difference in the coefficient of thermal expansion between the III-V compound crystal and the substrate. For example, the difference in the coefficient of thermal expansion is approximately 35% between sapphire and gallium nitride that are generally used. In this case, the coefficient of thermal expansion of sapphire is smaller compared with gallium nitride. Thus, due to the cooling, the sapphire substrate bends in such a manner that the gallium nitride side becomes a convex shape. To irradiate the buffer layer on the bent substrate with the laser beam to form the processed layer, the position at which the laser beam is focused (processing position) needs to be adjusted in conformity with the bending. This adjustment involves difficulty and therefore the formation of the peeling layer by laser beam irradiation is difficult. Furthermore, the bending substrate has internal stress and thus the bending shape of the substrate changes due to change in the stress of the sapphire substrate and the gallium nitride in the formation of the peeling layer. For this reason, the processing position at which the laser beam is focused changes and therefore the adjustment of the processing position becomes more difficult.

Thus, an object of the present invention is to provide a manufacturing method of a III-V compound crystal and a manufacturing method of semiconductor device in each of which it is easy to separate (peel off) a III-V compound crystal from a substrate.

In accordance with an aspect of the present invention, there is provided a manufacturing method of a III-V compound crystal. The manufacturing method includes a seed-crystal-formed substrate provision step of providing a seed-crystal-formed substrate in which a III-V compound seed crystal has been formed on a substrate, a seed crystal partial separation step of separating part of a portion in contact with the substrate in the III-V compound seed crystal from the substrate, and a crystal growth step of generating and growing the III-V compound crystal by reacting a group III element and a group V element with use of the III-V compound seed crystal as a nucleus after the seed crystal partial separation step.

In accordance with another aspect of the present invention, there is provided a manufacturing method of semiconductor device including a III-V compound crystal including steps for manufacturing the III-V compound crystal by the manufacturing method of a III-V compound crystal according to the present invention.

According to the present invention, it is possible to provide a manufacturing method of a III-V compound crystal and a manufacturing method of semiconductor device in each of which it is easy to separate (peel off) a III-V compound crystal from a substrate.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 7A and FIG. 7B are diagrams schematically depicting the structure of LPE apparatus used for a working example;

FIG. 8 is photographs of a GaN crystal manufactured in the working example and a sapphire substrate peeled off from the GaN crystal;

DETAILED DESCRIPTION OF THE PREFERRED EMBODIMENTS

Figure 1A:
FIG. 1A to FIG. 1G are step diagrams schematically depicting one example of a III-V compound crystal manufacturing method of the present invention.

The present invention will be described below by taking an example. However, the present invention is not limited by the following description. In a manufacturing method of a III-V compound crystal according to the present invention (hereinafter, often referred to as "III-V compound crystal manufacturing method of the present invention"), for example, part of a portion in contact with a substrate in a III-V compound seed crystal may be separated by irradiating the III-V compound seed crystal with a laser beam from the side of the substrate of a seed-crystal-formed substrate in a seed crystal partial separation step. In the present invention, "separation" also includes separation based on decomposition, peeling, removal, physical change, chemical change, or the like, for example. For example, to separate part of the portion in contact with the substrate in the III-V compound seed crystal from the substrate in the seed crystal partial separation step, the part of the portion in contact with the substrate may be separated from the substrate based on decomposition, peeling, removal, physical change, chemical change, or the like, for example.

For example, the III-V compound crystal manufacturing method of the present invention may further include a contact step of bringing a surface of the III-V compound seed crystal on the opposite side to the substrate into contact with a metallic melt after the seed crystal partial separation step, and a group III element and a group V element may be reacted in the metallic melt in a crystal growth step.

In the III-V compound crystal manufacturing method of the present invention, for example, the group V element may be nitrogen and the metallic melt may be an alkali metal melt and a III-V compound may be a group III nitride. Furthermore, a group III nitride crystal may be generated and grown with use of the III-V compound seed crystal as a nucleus by reacting the group III element and the nitrogen in the alkali metal melt under an atmosphere containing nitrogen in the crystal growth step.

In the III-V compound crystal manufacturing method of the present invention, for example, the group III element and the group V element may be reacted in a vapor phase in the crystal growth step. In the III-V compound crystal manufacturing method of the present invention, for example, the portion in contact with the substrate in the III-V compound seed crystal may be left into an island shape in the seed crystal partial separation step.

In the III-V compound crystal manufacturing method of the present invention, for example, the III-V compound seed crystal and the III-V compound crystal may be gallium nitride (GaN). For example, the III-V compound crystal manufacturing method of the present invention may further include a substrate separation step of separating the substrate from the III-V compound crystal after the crystal growth step.

In the III-V compound crystal manufacturing method of the present invention, for example, the substrate may be separated from the III-V compound crystal based on difference in an expansion rate or a contraction rate between the III-V compound crystal and the substrate due to temperature change in the substrate separation step. In the III-V compound crystal manufacturing method of the present invention, for example, the III-V compound crystal and the substrate may be cooled in the substrate separation step. In the III-V compound crystal manufacturing method of the present invention, for example, the substrate may be a sapphire substrate.

<1. Manufacturing Method of III-V Compound Crystal>

The manufacturing method of a III-V compound crystal according to the present invention can be carried out in the following manner, for example.

Figure 1B:
Figure 1C:
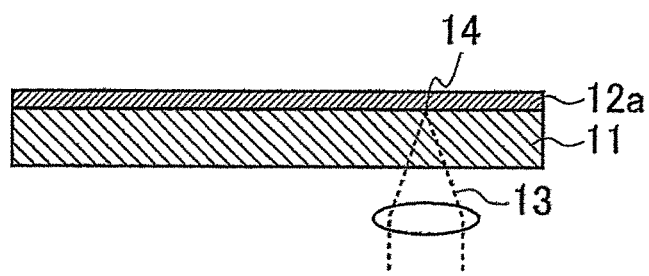
Figure 1D:
Figure 1E:
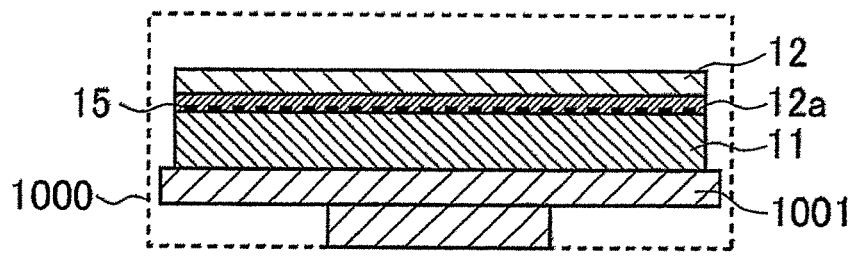
Figure 1F:
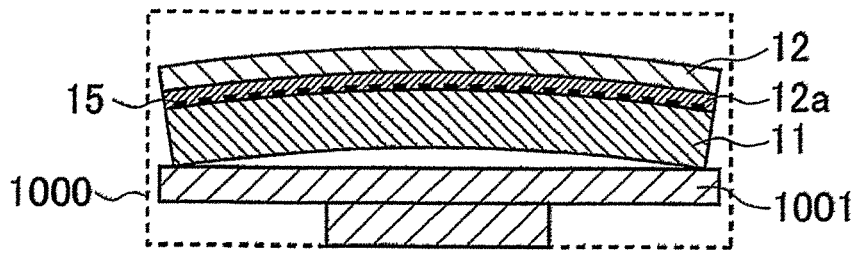
Figure 1G:
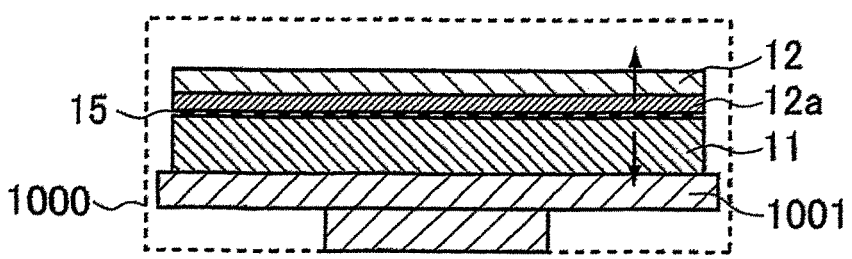

In step sectional views of FIG. 1A to FIG. 1G, one example of the manufacturing method of a III-V compound crystal according to the present invention is schematically depicted. First, as depicted in FIG. 1A and FIG. 1B, a seed-crystal-formed substrate in which a III-V compound seed crystal layer (III-V compound seed crystal) 12a has been formed on a substrate 11 is provided (seed-crystal-formed substrate provision step). Next, as depicted in FIG. 1C and FIG. 1D, part of the portion in contact with the substrate 11 in the III-V compound seed crystal 12a is separated from the substrate 11 (seed crystal partial separation step). Next, as depicted in FIG. 1E, after the seed crystal partial separation step, a III-V compound crystal 12 is generated and grown by reacting the group III element and the group V element with use of the III-V compound seed crystal 12a as a nucleus (crystal growth step). Moreover, as depicted in FIG. 1F and FIG. 1G, after the crystal growth step, the substrate 11 is separated from the III-V compound crystal 12 (substrate separation step).

The method for forming the III-V compound seed crystal 12a and the III-V compound crystal 12 is not particularly limited and may be a vapor phase growth method, for example. Apparatus used for the vapor phase growth method is not particularly limited and may be the same as a vapor phase growth furnace or the like used for a general vapor phase growth method, for example. In a sectional view of FIG. 2, one example of a vapor phase growth furnace used for the III-V compound crystal manufacturing method of the present invention is depicted. As depicted in the diagram, this vapor phase growth furnace 1000 internally has a table 1001 and a raw material housing part 1002. The substrate 11 can be placed on the table 1001. A raw material of a III-V compound crystal can be housed in the raw material housing part 1002. The raw material is not particularly limited and, for example, may be metallic gallium if the III-V compound crystal is gallium nitride (GaN). Moreover, the vapor phase growth furnace 1000 has an ammonia gas ($NH_3$) introduction pipe 1003, a hydrogen gas ($H_2$) introduction pipe 1004, and a hydrogen chloride gas (HCl) introduction pipe 1005 at the upper part thereof. In addition, the vapor phase growth furnace 1000 has a heater 1006 on an outer side surface and has an exhaust pipe 1007 at the lower part.

The manufacturing method of a III-V compound crystal based on FIG. 1A to FIG. 1G and FIG. 2 will be described more concretely below.

<1-1. Seed-Crystal-Formed Substrate Provision Step>

First, as depicted in FIG. 1A, the substrate 11 is prepared. The substrate 11 is not particularly limited. For example, sapphire substrate, silicon carbide substrate, gallium oxide ($Ga_2O_3$) substrate, silicon (Si) substrate, silicon nitride ($Si_3N_4$) substrate, gallium arsenide (GaAs) substrate, lithium aluminate ($LiAlO_2$) substrate, $ScAlMgO_4$ substrate, and so forth are cited. The shape and size of the substrate 11 are not particularly limited and can be set as appropriate according to the shape and size of a III-V compound crystal intended to be manufactured, or the like, for example. The shape of the substrate may be a rectangle or may be a circle, polygon, square, hexagon, octagon, or the like, for example. In the size of the substrate 11, the long diameter may be 5 to 20 cm or the like, for example. The thickness of the substrate 11 is also not particularly limited and may be 0.01 to 2 mm, 0.05 to 1.5 mm, or 0.1 to 1 mm, for example.

Next, as depicted in FIG. 1B, the III-V compound seed crystal layer (III-V compound seed crystal) 12a is formed on the substrate 11. The method for forming the III-V compound seed crystal layer 12a is not particularly limited and may be a vapor phase growth method, for example. The vapor phase growth method is also not particularly limited and may be the same as a general vapor phase growth method, for example. Furthermore, the vapor phase growth method may be the same as a concrete example of a method for generating and growing the III-V compound crystal 12, to be described later (crystal growth step), for example. In the present invention, as group III (group 13) elements, aluminum (Al), gallium (Ga), and indium (In) are cited, for example. As group V (group 15) elements, nitrogen (N), phosphorus (P), arsenic (As), and antimony (Sb) are cited, for example. The III-V compound seed crystal 12a may be a III-V compound represented as $Al_xGa_yIn_{1-x-y}N$ or $Al_xGa_yIn_{1-x-y}P$ ($0 \leq x \leq 1$, $0 \leq y \leq 1$, $x+y \leq 1$), for example, and it is preferable for the III-V compound seed crystal 12a to be a group III nitride. More concretely, as the III-V compound seed crystal 12a, AlGaN, InGaN, InAlGaN, AlN, GaP, GaN, and so forth represented by the above-described composition are cited, and GaN is particularly preferable. Furthermore, the composition (chemical formula) of the III-V compound seed crystal 12a may be identical to the III-V compound crystal 12 or may be different, for example. However, it is preferable that the composition be identical.

The thickness of the III-V compound seed crystal layer 12a is also not particularly limited and may be 0.001 to 1000 µm, 0.01 to 100 µm, or 0.1 to 50 µm, for example. In terms of easiness of processing of the III-V compound seed crystal layer 12a in the seed crystal partial separation step to be described later (easiness of separation of part of the portion in contact with the substrate 11 in the III-V compound seed crystal 12a from the substrate 11), it is preferable that the thickness of the III-V compound seed crystal layer 12a be not too small. Meanwhile, in view of suppression or prevention of warpage of the III-V compound crystal 12 and the substrate 11 after the substrate separation step to be described later, it is preferable that the thickness of the III-V compound seed crystal layer 12a be not too large.

In the above-described manner, the seed-crystal-formed substrate in which the III-V compound seed crystal layer 12a has been formed on the substrate 11 can be provided. In FIG. 1A and FIG. 1B, the example, in which the III-V compound seed crystal layer 12a is formed on the substrate 11 is depicted. However, instead of this, a seed-crystal-formed substrate prepared in advance may be acquired.

<1-2. Seed Crystal Partial Separation Step>

Next, as depicted in FIG. 1C and FIG. 1D, part of the portion in contact with the substrate 11 in the III-V compound seed crystal 12a is separated from the substrate 11 (seed crystal partial separation step).

As described above, in the present invention, to separate part of the portion in contact with the substrate in the III-V compound seed crystal from the substrate, the part of the portion in contact with the substrate may be separated from the substrate based on decomposition, peeling, removal, physical change, chemical change, or the like, for example. If the separation is based on physical processing, the part of the portion in contact with the substrate in the III-V compound seed crystal can be easily separated from the substrate without using resist (etching mask), etchant, and so forth. The physical processing is not particularly limited and cutting processing, processing based on causing particles or waves to impinge on the III-V compound seed crystal, or the like is cited, for example. Among them, the processing based on causing particles or waves to impinge on the III-V compound seed crystal is preferable. As the processing based on causing particles or waves to impinge on the III-V compound seed crystal, laser beam irradiation, particle (ion or electron) beam irradiation, milling processing, shot blasting, abrasive water jet, ultrasonic processing, and so forth are cited, for example. Among them, the laser beam irradiation is particularly preferable. This is because the laser beam irradiation allows precise processing to be carried out more easily. Concretely, for example, the laser beam irradiation is carried out for the position at which separation from the substrate is desired in the III-V compound seed crystal.

With FIG. 1C and FIG. 1D, a method in which the III-V compound seed crystal 12a is irradiated with a laser beam from the side of the substrate 11 will be described. Specifically, as depicted in FIG. 1C, a laser beam 13 is focused at a position (processing position) 14 at which separation from the substrate 11 is desired in the III-V compound seed crystal layer 12a and irradiation is carried out. Due to this, as depicted in FIG. 1D, at the processing positions 14 irradiated with the laser beam 13, the III-V compound seed crystal layer 12a is separated from the substrate 11 and processing marks 15 are formed. Although the phenomenon (mechanism) that occurs at this time is unclear, for example, it is inferred that, due to the irradiation of the processing position 14 with the laser beam 13, the III-V compound seed crystal 12*a* at the position decomposes (chemically changes) to be separated from the substrate 11. If the III-V compound seed crystal 12*a* is GaN, it is inferred that the GaN changes to metallic gallium due to irradiation with the laser beam 13, for example. The melting point of the metallic gallium is approximately 30° C. and therefore the metallic gallium is easily separated from the substrate 11. However, these inferences do not limit the present invention at all.

The wavelength of the laser beam 13 is not particularly limited. However, it is preferable for the wavelength of the laser beam 13 to be a wavelength that allows processing of the III-V compound seed crystal 12*a* without affecting the substrate 11. For this purpose, it is preferable for the wavelength of the laser beam to be such a wavelength as to be absorbed by the III-V compound seed crystal layer 12*a* and be transmitted through the substrate 11. In this case, the absorbance of the III-V compound seed crystal layer 12*a* with respect to the laser beam may be 20% or higher, 50% or higher, or 80% or higher, for example, and is 100% ideally. Furthermore, the transmittance of the substrate 11 with respect to the laser beam 13 may be 90% or higher, 95% or higher, or 98% or higher, for example, and is 100% ideally. The method for measuring the absorbance of the III-V compound seed crystal layer 12*a* and the transmittance of the substrate 11 with respect to the laser beam is not particularly limited. For example, the absorbance and the transmittance can be measured by using a general spectrophotometer. The wavelength of the laser beam 13 is not particularly limited and may be 150 to 1300 nm, 193 to 1100 nm, 193 to 500 nm, or 193 to 400 nm, for example. The wavelength of the laser beam 13 can be set as appropriate also in consideration of the material and so forth of the substrate 11 and the III-V compound seed crystal layer 12*a*. If the substrate 11 is a sapphire substrate and the III-V compound seed crystal layer 12*a* is GaN, the wavelength of the laser beam 13 may be 193 to 500 nm, 193 to 355 nm, 200 to 350 nm, or 230 to 300 nm, for example. More concretely, a laser beam with a wavelength of 266 nm or 355 nm or the like can be used, for example.

The output power of the laser beam 13 is also not particularly limited and may be 0.01 to 100 W, 0.05 to 50 W, or 1 to 20 W, for example. The spot diameter of the laser beam 13 is also not particularly limited and may be 1 to 400 μm, 5 to 150 μm, or 10 to 80 μm, for example. The energy density of the laser beam 13 is also not particularly limited and may be 0.001 to 20 J/cm$^2$, 0.002 to 10 J/cm$^2$, or 0.006 to 5 J/cm$^2$, for example. Furthermore, for example, processing may be carried out in such a manner that the III-V compound seed crystal layer 12*a* is irradiated with the laser beam 13 while the spot of the laser beam 13 is moved to change the processing position (irradiation position of the laser beam 13) 14. The movement speed (feed speed) of the spot of the laser beam 13 is also not particularly limited and may be 1 to 1000 mm/second, 10 to 500 mm/second, or 50 to 300 mm/second, for example. Moreover, the direction of irradiation with the laser beam 13 is also not particularly limited. For example, irradiation may be carried out from the side of the III-V compound seed crystal layer 12*a* or irradiation may be carried out from the side of the substrate 11. However, it is preferable to carry out irradiation from the side of the substrate 11 as depicted in FIG. 1D. This can selectively process only the side in contact with the substrate 11 in the III-V compound seed crystal layer 12*a* while leaving the side that is not in contact with the substrate 11.

Furthermore, the medium and laser oscillator of the laser beam 13 are also not particularly limited. For example, YAG laser, YVO$_4$ laser, YLF laser, disk laser, DPSS laser, excimer laser, fiber laser, and so forth are cited. Furthermore, the laser beam may be a pulse laser beam or a continuous wave (CW) laser beam. In the case of the pulse laser beam, the frequency thereof is not particularly limited and may be 10 Hz to 100 MHz, 1 to 1000 kHz (1 MHz), or 10 to 200 kHz, for example. The pulse width of the pulse laser beam is also not particularly limited. However, in view of suppression of thermal diffusion, the pulse width is 0.2 ps (0.2 picoseconds or 200 fs (femtoseconds)) to 10 ns, 5 to 500 ps (picoseconds), or 5 to 200 ps, for example.

In the side on which the III-V compound seed crystal (III-V compound seed crystal layer) 12*a* is in contact with the substrate 11, the III-V compound seed crystal layer 12*a* is left while remaining in contact with the substrate 11 at the part that is not irradiated with the laser beam 13, i.e. the part other than the processing positions 14. The shape of this left part is not particularly limited. Stripe shape, island shape (dot shape), and so forth are cited and the dot shape is particularly preferable. In the case of the dot shape, the shape thereof is not particularly limited and may be a circle or may be an ellipse, polygon, equilateral polygon, triangle, equilateral triangle, tetragon, square, rectangle, pentagon, equilateral pentagon, hexagon, equilateral hexagon, or the like, for example. The size of the parts at which the III-V compound seed crystal 12*a* is left and the interval thereof are also not particularly limited. The size and the interval can be set as appropriate in such a manner that the substrate 11 is not peeled off (separated) from the III-V compound seed crystal 12*a* until the substrate separation step to be described later and is easily peeled off (separated) from the III-V compound seed crystal 12*a* in the substrate separation step to be described later, for example. If the parts at which the III-V compound seed crystal 12*a* is left have a stripe shape, the width thereof may be 100 mm or smaller, 10 mm or smaller, 1 mm or smaller, or 500 μm or smaller, for example, and may be 0.001 μm or larger, 0.1 μm or larger, 1 μm or larger, or 10 μm or larger, for example. If the parts at which the III-V compound seed crystal 12*a* is left have a dot shape, the long diameter of the dot (longest diameter, for example, long side in the case of a rectangle) may be 100 mm or smaller, 10 mm or smaller, 1 mm or smaller, or 500 μm or smaller, for example, and may be 0.001 μm or larger, 0.1 μm or larger, 1 μm or larger, or 10 μm or larger, for example. The short diameter of the dot (shortest diameter, for example, short side in the case of a rectangle) may be 100 mm or smaller, 10 mm or smaller, 1 mm or smaller, or 500 μm or smaller, for example, and may be 0.001 μm or larger, 0.1 μm or larger, 1 μm or larger, or 10 μm or larger, for example. Furthermore, in the parts at which the III-V compound seed crystal 12*a* is left, the interval between parts adjacent to each other may be 100 mm or smaller, 10 mm or smaller, 1 mm or smaller, or 500 μm or smaller, for example, and may be 0.001 μm or larger, 0.1 μm or larger, 1 μm or larger, or 10 μm or larger, for example. The arrangement of the parts at which the III-V compound seed crystal 12*a* is left is also not particularly limited. For example, assuming that plural rectangles (oblongs) congruent with each other are laid on the substrate 11 without a gap, the parts at which the III-V compound seed crystal 12*a* is left may be disposed at the respective vertexes of the rectangles. Furthermore, instead of the rectangles, squares, rhombi, trapezoids, or the like may be employed, for example, or equilateral triangles may be employed, for example. Alternatively, triangles other than equilateral triangles may be employed. The mutual arrangement relationship between the III-V compound seed crystals 12*a* is also not particularly limited and any arrangement such as a spiral manner, concentric circular manner, or radial manner may be employed, for example.

Furthermore, the area of the processing positions 14 (parts separated from the substrate 11 in the III-V compound seed crystal 12*a*) is not particularly limited. For example, with respect to the area of the whole of the III-V compound seed crystal 12*a*, the area of the processing positions 14 may be 0.001% or higher, 0.01% or higher, 0.1% or higher, 1% or higher, 5% or higher, 10% or higher, 20% or higher, 30% or higher, 40% or higher, or 50% or higher and may be 99.9% or lower, 99% or lower, 90% or lower, 80% or lower, 70% or lower, 60% or lower, or 50% or lower. In view of easiness of processing and a small number of defects of the III-V compound crystal 12 to be described later, it is preferable that the ratio of the area of the processing positions 14 to the area of the whole of the III-V compound seed crystal 12*a* be not too large. Meanwhile, in view of easiness of separation (peeling) between the III-V compound crystal 12 to be described later and the substrate 11, it is preferable that the ratio of the area of the processing positions 14 to the area of the whole of the III-V compound seed crystal 12*a* be not too small.

Laser processing apparatus that carries out irradiation with the laser beam 13 to process the III-V compound seed crystal 12*a* is also not particularly limited and publicly-known laser processing apparatus may be used, for example. One example of the laser processing apparatus is depicted in a perspective view of FIG. 3. As depicted in the diagram, this laser processing apparatus 10 includes a stationary base 20, a holding table mechanism 30, a laser beam irradiation unit support mechanism 40, and a laser beam irradiation unit 50. The holding table mechanism 30 is set on the stationary base 20 and holds a workpiece. In addition, the holding table mechanism 30 can move in a processing-feed direction depicted by arrows X. The laser beam irradiation unit support mechanism 40 is set on the stationary base 20 and can move in an indexing-feed direction depicted by arrows Y. The arrows Y are orthogonal to the processing-feed direction depicted by the arrows X as depicted in the diagram. The laser beam irradiation unit 50 is attached to the laser beam irradiation unit support mechanism 40 and can move in a focal point position adjustment direction depicted by arrows Z. The arrows Z are orthogonal to the arrows X and Y as depicted in the diagram.

The holding table mechanism 30 includes guide rails 310, a first slide block 320, a second slide block 330, a support cylindrical body 340 with a circular cylindrical shape, a cover table 350, and a holding table 360. The number of guide rails 310 is two (one pair) and they are disposed on the stationary base 20 in parallel along the processing-feed direction depicted by the arrows X. The first slide block 320 is disposed on the pair of guide rails 310 and can move in the processing-feed direction depicted by the arrows X. The second slide block 330 is disposed over the first slide block 320 and can move in the indexing-feed direction depicted by the arrows Y. The cover table 350 and the holding table 360 as a workpiece holding unit are supported over the second slide block 330 by the support cylindrical body 340 with the circular cylindrical shape.

In the lower surface of the first slide block 320, two (one pair) guided grooves 3210 fitted to the pair of guide rails 310 are made. Furthermore, on the upper surface of the first slide block 320, two (one pair) guide rails 3220 formed in parallel along the indexing-feed direction depicted by the arrows Y are set. Due to the fitting of the pair of guided grooves 3210 to the pair of guide rails 310, this first slide block 320 can move in the processing-feed direction depicted by the arrows X along the pair of guide rails 310. Moreover, the holding table mechanism 30 depicted in the diagram has a processing feed unit 370 for moving the first slide block 320 in the processing-feed direction depicted by the arrows X along the pair of guide rails 310. The processing feed unit 370 includes a male screw rod 3710. The male screw rod 3710 is set between the pair of guide rails 310 in parallel to the guide rails 310. The processing feed unit 370 further includes a drive source such as a pulse motor 3720 for rotationally driving the male screw rod 3710. One end of the male screw rod 3710 is freely rotatably supported by a bearing block 3730 fixed to the stationary base 20. Furthermore, the other end of the male screw rod 3710 is joined to the output shaft of the pulse motor 3720 for power transmission. The male screw rod 3710 is screwed (fitted) to a penetrating female screw hole of a female screw block (not depicted) that protrudes on the lower surface of the central part of the first slide block 320. Therefore, by forward or reverse driving of the male screw rod 3710 by the pulse motor 3720, the first slide block 320 can move in the processing-feed direction depicted by the arrows X along the pair of guide rails 310.

In the lower surface of the second slide block 330, a pair of guided grooves 3310 fitted to the pair of guide rails 3220 set on the upper surface of the first slide block 320 are made. By fitting the pair of guided grooves 3310 to the pair of guide rails 3220, the second slide block 330 is enabled to move in the indexing-feed direction depicted by the arrows Y. Furthermore, the holding table mechanism 30 depicted in the diagram includes a first indexing feed unit 380. The first indexing feed unit 380 is a unit for moving the second slide block 330 in the indexing-feed direction depicted by the arrows Y along the pair of guide rails 3220 set on the first slide block 320. The first indexing feed unit 380 includes a male screw rod 3810. The male screw rod 3810 is disposed between the pair of guide rails 3220 in parallel to the guide rails 3220. The first indexing feed unit 380 further includes a drive source such as a pulse motor 3820 for rotationally driving the male screw rod 3810. One end of the male screw rod 3810 is freely rotatably supported by a bearing block 3830 fixed to the upper surface of the first slide block 320. The other end of the male screw rod 3810 is joined to the output shaft of the pulse motor 3820 for power transmission. Moreover, the male screw rod 3810 is screwed (fitted) to a penetrating female screw hole of a female screw block (not depicted) that protrudes on the lower surface of the central part of the second slide block 330. Therefore, by forward or reverse driving of the male screw rod 3810 by the pulse motor 3820, the second slide block 330 can move in the indexing-feed direction depicted by the arrows Y along the pair of guide rails 3220.

The laser beam irradiation unit support mechanism 40 includes guide rails 410 and a movable support base 420. The number of guide rails 410 is two (one pair) and they are disposed on the stationary base 20 in parallel along the indexing-feed direction depicted by the arrows Y. The movable support base 420 is disposed on the pair of guide rails 410 movably in the direction depicted by the arrows Y. This movable support base 420 includes a moving support part 4210 movably disposed on the pair of guide rails 410 and a mounting part 4220 attached to the moving support part 4210. On one side surface of the mounting part 4220, a pair of guide rails 4230 that extend along the focal point position adjustment direction depicted by the arrows Z are set in parallel to each other. The laser beam irradiation unit support mechanism 40 depicted in the diagram includes a second indexing feed unit 430. The second indexing feed unit 430 is a unit for moving the movable support base 420 in the indexing-feed direction depicted by the arrows Y along the pair of guide rails 410. The second indexing feed unit 430 includes a male screw rod 4310. The male screw rod 4310 is disposed between the pair of guide rails 410 in parallel to the guide rails 410. The second indexing feed unit 430 further includes a drive source such as a pulse motor 4320 for rotationally driving the male screw rod 4310. One end of the male screw rod 4310 is freely rotatably supported by a bearing block (not depicted) fixed to the stationary base 20. The other end of the male screw rod 4310 is joined to the output shaft of the pulse motor 4320 for power transmission. Moreover, the male screw rod 4310 is screwed (fitted) to a female screw hole of a female screw block (not depicted) that protrudes on the lower surface of the central part of the moving support part 4210 forming the movable support base 420. Thus, by forward or reverse driving of the male screw rod 4310 by the pulse motor 4320, the movable support base 420 can move in the indexing-feed direction depicted by the arrows Y along the pair of guide rails 410.

The laser beam irradiation unit 50 depicted in the diagram includes a unit holder 510 and a laser beam irradiator 60 attached to the unit holder 510. In the unit holder 510, a pair of guided grooves 5110 slidably fitted to the pair of guide rails 4230 provided on the mounting part 4220 are made. Due to the fitting of the pair of guided grooves 5110 to the pair of guide rails 4230, the unit holder 510 is supported movably in the focal point position adjustment direction depicted by the arrows Z.

The laser beam irradiation unit 50 depicted in the diagram includes a focal point position adjustment unit 530. The focal point position adjustment unit 530 is a unit for moving the unit holder 510 in the focal point position adjustment direction depicted by the arrows Z along the pair of guide rails 4230. The focal point position adjustment unit 530 includes a male screw rod (not depicted) disposed between the pair of guide rails 4230 and a drive source such as a pulse motor 5320 for rotationally driving the male screw rod. By forward or reverse driving of the male screw rod (not depicted) by the pulse motor 5320, the unit holder 510 and the laser beam irradiator 60 can move in the focal point position adjustment direction depicted by the arrows Z along the pair of guide rails 4230. In the embodiment depicted in the diagram, the laser beam irradiator 60 can be moved upward by the forward driving of the pulse motor 5320 and the laser beam irradiator 60 can be moved downward by the reverse driving of the pulse motor 5320.

The laser beam irradiator 60 depicted in the diagram includes a casing 610 that is disposed substantially horizontally and has a circular cylindrical shape. A laser oscillator (laser beam oscillation unit, not depicted) is disposed in the casing 610. This laser oscillator can emit a laser beam. As the laser beam, a pulse laser beam or a CW laser beam ray is cited, for example. Preferably, the laser beam is a pulse laser beam. The laser oscillator is not particularly limited and is, for example, as described above. Characteristics of the laser beam emitted by the laser oscillator, such as wavelength, output power, spot diameter, energy density, movement speed (feed speed), frequency, and pulse width, are also not particularly limited and are, for example, as described above. The laser beam oscillated from the laser oscillator is emitted from a light collector 640 located at the tip of the casing 610 to a workpiece (for example, stacked substrate in which a III-V compound layer is stacked on a substrate or a stacked object in which a III-V compound crystal is stacked on a substrate) held by the holding table 360. Furthermore, an imaging unit 90 exists at the tip of the casing 610. For example, this imaging unit 90 includes a normal imaging element (charge coupled device (CCD)) that carries out imaging by a visible light ray, an infrared illumination unit that irradiates the workpiece with an infrared ray, an optical system that captures the infrared ray with which irradiation is carried out by the infrared illumination unit, an imaging element (infrared CCD) that outputs an electrical signal corresponding to the infrared ray captured by the optical system, and so forth. The imaging unit 90 sends an image signal obtained by imaging to a control unit (not depicted).

Next, an example of a laser processing method by the laser processing apparatus 10 of FIG. 3 will be described. First, as depicted in FIG. 4, a workpiece 400 composed of two layers (upper-layer part 200, lower-layer part 300) is stuck to an adhesive tape T mounted on a ring-shaped frame F (workpiece sticking step). At this time, a front surface 200$b$ of the workpiece 400 is oriented upward and the side of a back surface 30$b$ is stuck to the adhesive tape T. The adhesive tape T may be formed from a resin sheet of polyvinyl chloride (PVC) or the like, for example. The ring-shaped frame F is set on the holding table 360 depicted in FIG. 3. In the workpiece 400, for example, the upper-layer part 200 may be the substrate 11 in FIG. 1 and the lower-layer part 300 may be the III-V compound crystal 12 or the III-V compound seed crystal 12$a$ in FIG. 1.

Figure 3:
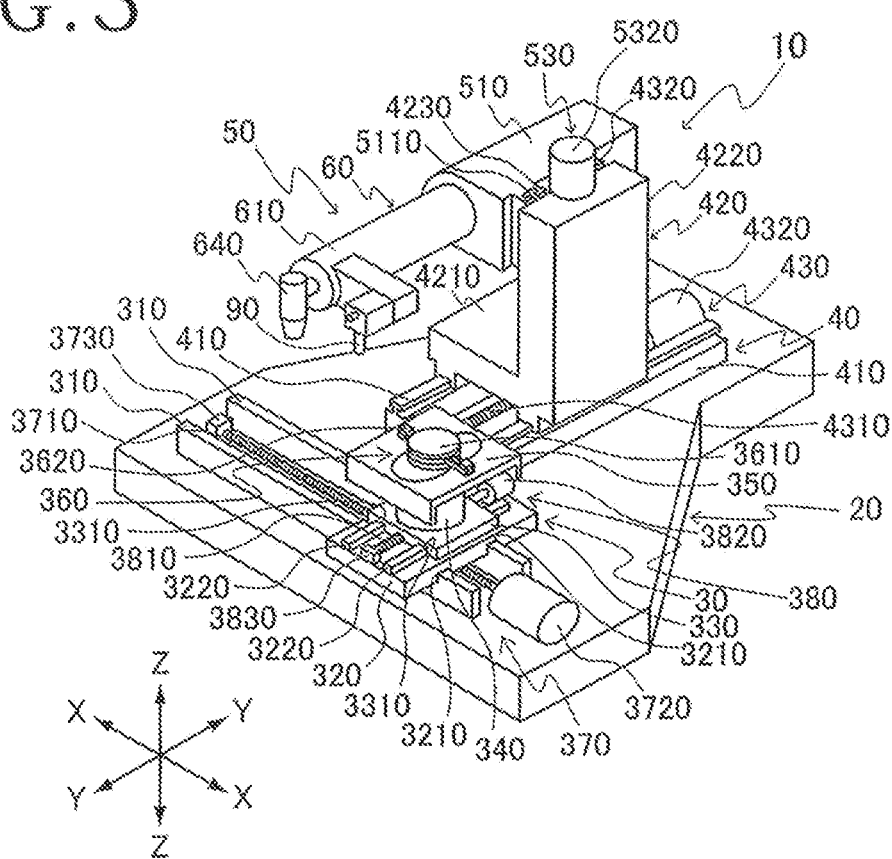
FIG. 3 is a perspective view depicting one example of laser processing apparatus used for the III-V compound crystal manufacturing method of the present invention.
Figure 4:
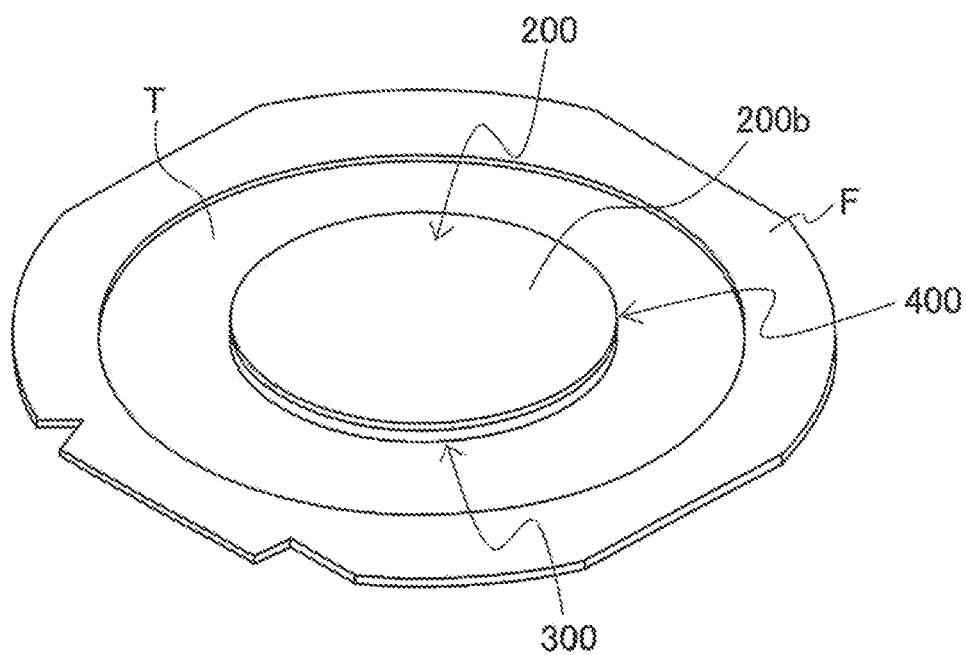
FIG. 4 is a perspective view of a state in which a workpiece in the laser processing apparatus of FIG. 3 is fixed to a frame.
Figure 5:
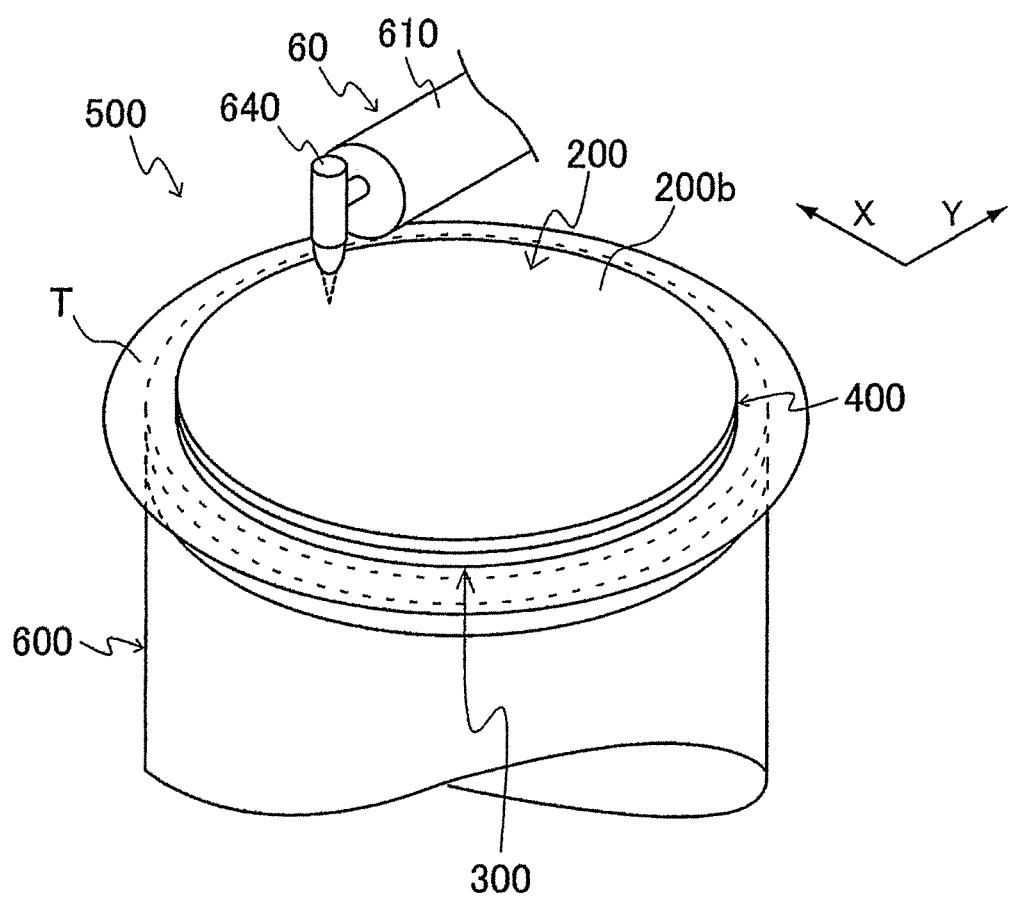
FIG. 5 is a perspective view depicting a state in which the workpiece in FIG. 4 is positioned below a light collector in a laser beam irradiator.
Figure 6A:
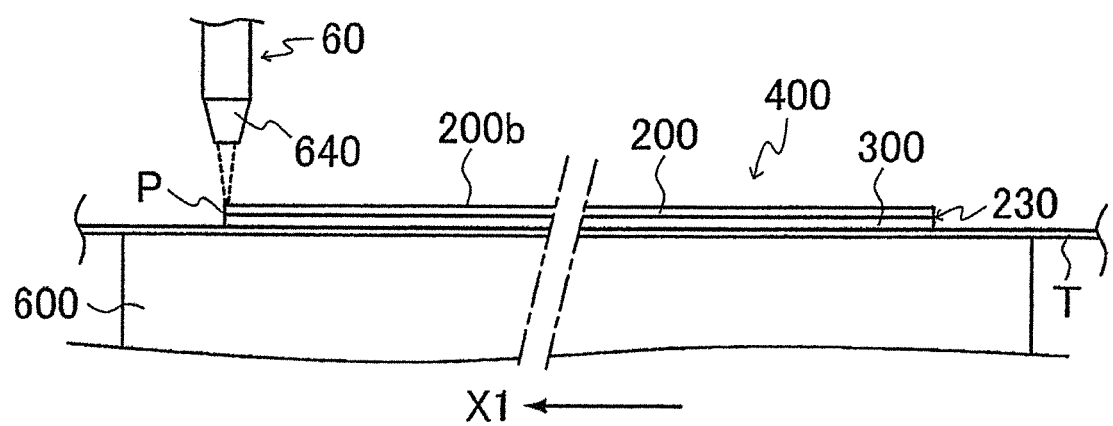
FIG. 6A is a front view depicting the state in which the workpiece in FIG. 4 is positioned below the light collector in the laser beam irradiator.
Figure 6B:
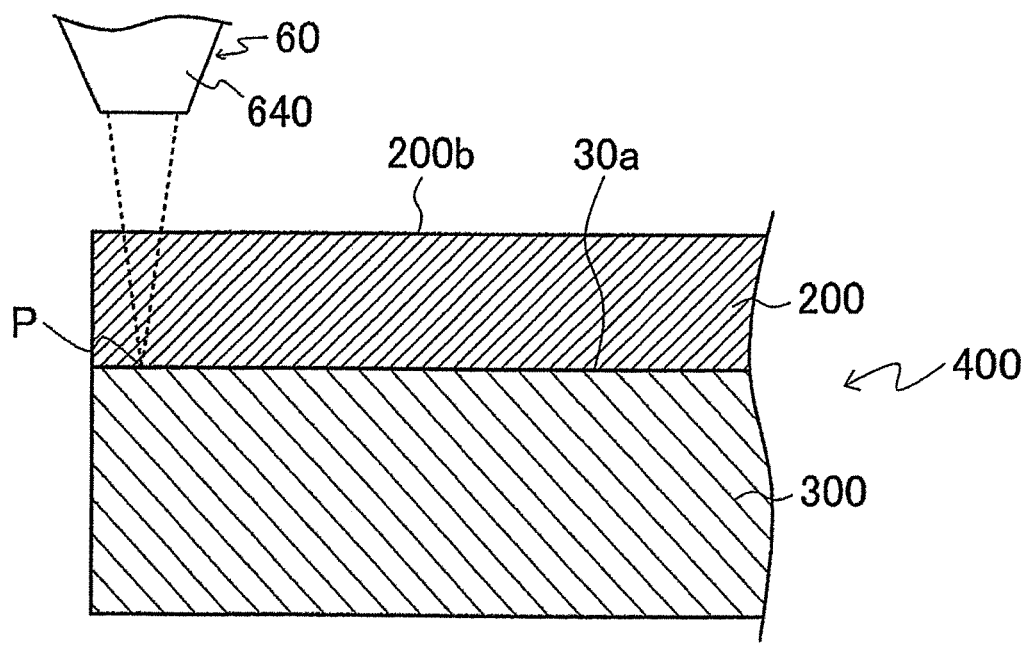
FIG. 6B is a sectional view thereof.

Next, the holding table 360 depicted in FIG. 3 is moved to a laser beam irradiation region above which the light collector 640 of the laser beam irradiator 60 is located. Due to this, as depicted in a perspective view of FIG. 5 and a front view of FIG. 6A, the workpiece 400 is disposed below the light collector 640 and the workpiece 400 can be irradiated with a laser beam. For example, first, an end 230 of the workpiece 400 (left end in FIG. 6A) is disposed just below the light collector 640 as depicted in FIG. 6A. Next, a focal point P of the laser beam with which irradiation is carried out from the light collector 640 is adjusted to the vicinity of the front surface 200$b$ (upper surface) of the workpiece 400 as depicted in FIG. 6A. Alternatively, as depicted in a sectional view of FIG. 6B, the focal point of the laser beam is adjusted to an interface 30$a$ of the workpiece 400 of two layers composed of the upper-layer part 200 and the lower-layer part 300. Then, irradiation with the laser beam is carried out from the light collector 640 of the laser beam irradiator 60 and the processing feed unit 370 (FIG. 3) is actuated to move the holding table 360 (FIG. 3) in a direction depicted by an arrow X1 in FIG. 6A at a predetermined processing feed speed. If the laser beam with which irradiation is carried out from the light collector 640 is a pulse laser beam, it is preferable that the pulse width thereof synchronize with the movement speed of the processing feed unit 370. This allows irradiation with each one shot of the pulse laser beam at high speed with high-speed switching of the pulse laser beam between ON and OFF. By irradiating the necessary places in the workpiece 400 with the laser beam in this manner, part of the portion in contact with the substrate in the III-V compound seed crystal can be separated in the seed crystal partial separation step, for example.

<1-3. Crystal Growth Step>

Next, as depicted in FIG. 1E, after the seed crystal partial separation step, the III-V compound crystal 12 is generated and grown by reacting the group III element and the group V element with use of the III-V compound seed crystal 12$a$ as a nucleus (crystal growth step). This method is not particularly limited and may be either a liquid phase growth method or a vapor phase growth method as described above. In FIG. 1E, an example of the vapor phase growth method is depicted. This method can be carried out with the seed-crystal-formed substrate (substrate 11 on which the III-V compound seed crystal 12a has been formed) placed on the table 1001 in the vapor phase growth furnace 1000 as depicted in FIG. 1E. As the vapor phase growth furnace 1000, the furnace described with FIG. 2 can be used.

An example of a method for carrying out the crystal growth step depicted in FIG. 1E will be concretely described below. In the following, a method for carrying out the crystal growth step by MOCVD (MOVPE) with use of the vapor phase growth furnace of FIG. 2 will be described.

First, the seed-crystal-formed substrate in which the III-V compound seed crystal layer 12a has been formed on the substrate 11 is placed on the table 1001 in the vapor phase growth furnace 1000.

Figure 2:
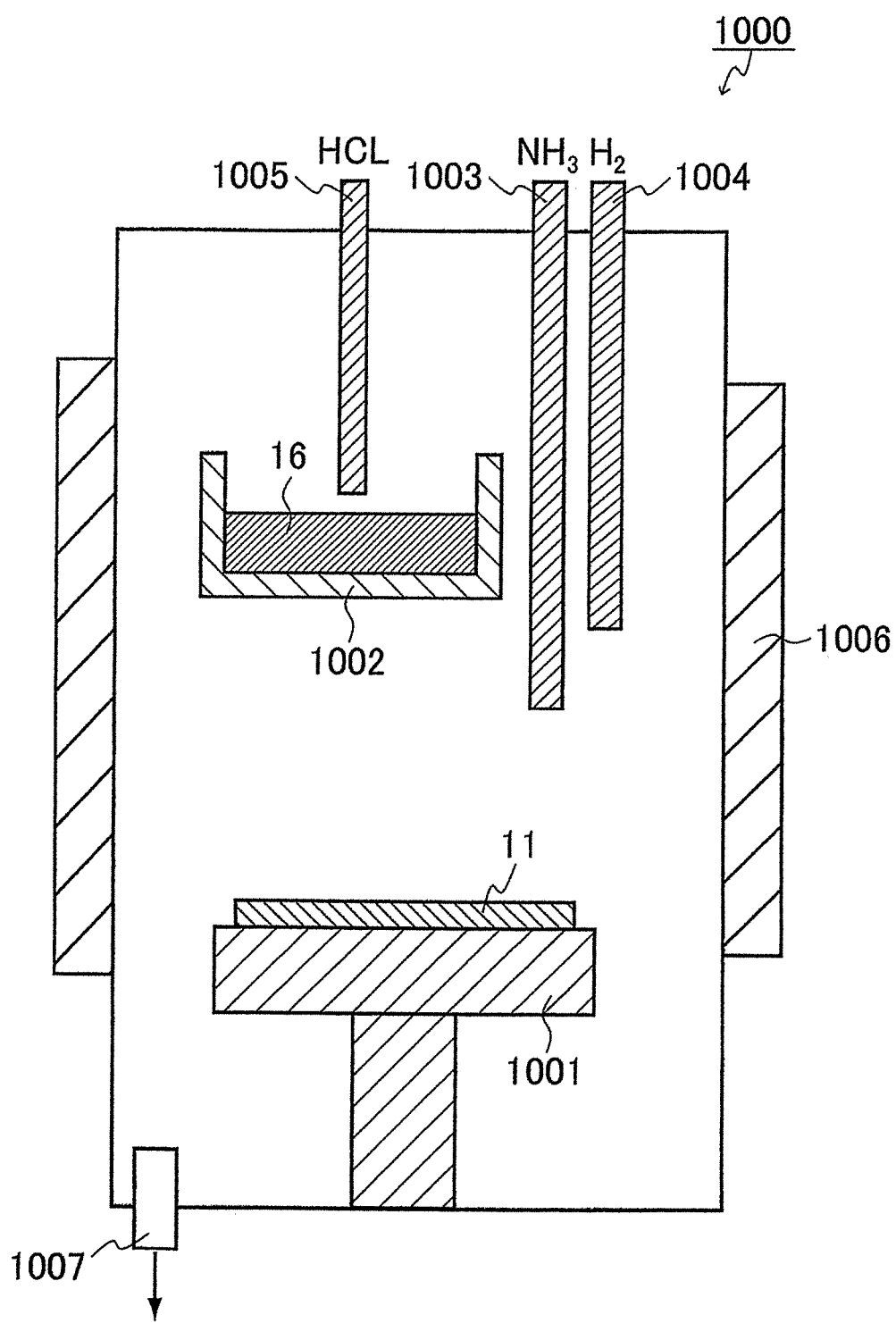
FIG. 2 is a sectional view schematically depicting one example of a vapor phase growth furnace used for the III-V compound crystal manufacturing method of the present invention.

Meanwhile, as depicted in FIG. 2, a raw material 16 of the III-V compound crystal is housed (set) in the raw material housing part 1002. The raw material 16 is not particularly limited and is, for example, a group III element metal. As the group III element metal, aluminum (Al), gallium (Ga), indium (In), thallium (Tl), and so forth are cited, for example. Only one kind of metal may be used or two or more kinds of metals may be used in combination. For example, as the group III element metal, at least one selected from a group consisting of aluminum (Al), gallium (Ga), and indium (In) may be used. In this case, the composition of the manufactured group III element nitride crystal is represented as $Al_sGa_tIn_{\{1-(s+t)\}}N$ ($0 \leq s \leq 1$, $0 \leq t \leq 1$, $s+t \leq 1$). As described above, for example, if the III-V compound crystal is gallium nitride (GaN), the group III element metal is metallic gallium. Furthermore, a dopant material or the like may be made to coexist in and react with the raw material 16, for example. As the dopant, Si, S, Te, Mg, Fe, Ge, Sn, Se, Zn, Ru, O, C, and so forth are cited, for example, although the dopant is not particularly limited. In the case of making these dopants coexist in the raw material 16, the dopants can be used in the form of single element, oxide, halide, or the like of them, for example.

Next, the vapor phase growth furnace 1000 is heated by the heater 1006. At this time, the temperature of the raw material 16 is not particularly limited and is set to 700° C. to 1500° C., 800° C. to 1400° C., or 900° C. to 1300° C., for example. The temperature of the substrate 11 is not particularly limited and is set to 700° C. to 1500° C., 800° C. to 1400° C., or 900° C. to 1300° C., for example. In this state, an ammonia gas, a hydrogen gas, and a hydrogen chloride gas are introduced from the ammonia gas ($NH_3$) introduction pipe 1003, the hydrogen gas ($H_2$) introduction pipe 1004, and the hydrogen chloride gas (HCl) introduction pipe 1005, respectively. At this time, the concentration of the ammonia gas ($NH_3$) with respect to the whole gas in the vapor phase growth furnace 1000 is not particularly limited and is set to 25 to 80 mol %, 40 to 70 mol %, or 50 to 60 mol %, for example. Furthermore, at this time, the concentration of the hydrogen gas ($H_2$) with respect to the whole gas in the vapor phase growth furnace 1000 is not particularly limited and is set to 0 to 75 mol % or 20 to 50 mol %, for example. The flow rate of the hydrogen chloride gas (HCl) is not particularly limited and is set to 20 to 100 sccm or 40 to 60 sccm, for example.

If the raw material 16 is metallic gallium, a crystal of the intended GaN (III-V compound) will be generated and grown based on the following reaction formulae (I) and (II), for example. The hydrogen gas introduced from the hydrogen gas ($H_2$) introduction pipe 1004 works as a gas for partial pressure control for controlling the partial pressure of the hydrogen chloride gas and the ammonia gas. Furthermore, the excess gas after the reaction is discharged from the exhaust pipe 1007 as an exhaust gas.

$$Ga+HCl \rightarrow GaCl+1/2H_2 \qquad (I)$$

$$GaCl+2NH_3 \rightarrow GaN+H_2+NH_4Cl \qquad (II)$$

The crystal growth step in the crystal growth furnace 1000 may be carried out under a pressurized condition, for example. However, the crystal growth step may be carried out under a reduced-pressure condition or may be carried out under a condition in which neither pressurization nor pressure reduction is carried out, for example. Concretely, in the crystal growth step, the pressure in the crystal growth furnace 1000 is not particularly limited and may be set to 10 Pa to 1 MPa, 100 Pa to 500 kPa, or 1 kPa to 100 kPa, for example.

In this manner, the III-V compound crystal 12 is grown until the thickness thereof becomes the intended thickness. The thickness of the III-V compound crystal 12 is not particularly limited and may be set to 0.001 to 1000 mm, 0.01 to 100 mm, or 0.1 to 10 mm, for example.

It is also possible to carry out the crystal growth step by using a liquid phase growth method instead of the vapor phase growth method. In this case, the crystal growth step can be carried out in the following manner, for example.

First, the surface on the opposite side to the substrate 11 in the III-V compound seed crystal 12a of the seed-crystal-formed substrate is brought into contact with a metallic melt (contact step). Moreover, the III-V compound crystal is generated and grown with use of the seed crystal as a nucleus by reacting the group III element and the group V element in the metallic melt (crystal growth step).

The reaction condition in the contact step and the crystal growth step is not particularly limited and reaction conditions described in Japanese Patent No. 4920875, Japanese Patent No. 4422473, Japanese Patent No. 4588340, and so forth may be employed as reference, for example. Furthermore, for example, apparatus used for the contact step and the crystal growth step is not particularly limited. The apparatus may be the same as apparatus (LPE apparatus) used for a general liquid phase growth method or may be the same as LPE apparatus described in Japanese Patent No. 4920875, Japanese Patent No. 4422473, Japanese Patent No. 4588340, and so forth.

The composition of the III-V compound crystal 12 generated and grown from the III-V compound seed crystal 12a is not particular limited and may be the same as the case of the above-described vapor phase growth method, for example. The composition of the III-V crystal can be adjusted based on the kinds, the ratio of the use amounts, and so forth of the group III element and the group V element in the crystal growth step. For example, if the III-V compound crystal is a group III nitride crystal, it is preferable that the above-described group V element reacted in the crystal growth step be nitrogen. Furthermore, in this case, it is preferable that the above-described metallic melt be an alkali metal melt and, in the crystal growth step, the III-V compound crystal 12 be generated and grown with use of the III-V compound seed crystal 12a as a nucleus by reacting the group III element and the nitrogen in the alkali metal melt under an atmosphere containing nitrogen.

The contact step and the crystal growth step by the liquid phase growth method can be carried out in the following manner, for example.

In the contact step and the crystal growth step, for example, a sodium flux method (Na flux method), which is one of manufacturing methods of gallium nitride (GaN) used for semiconductor substrates of LED and power device, may be used. For example, first a seed crystal (for example, GaN thin film formed on a sapphire substrate) is set in a crucible. Furthermore, together with the seed crystal, sodium (Na) and gallium (Ga) are housed in the crucible at an appropriate ratio. Next, the sodium and the gallium in the crucible are melted under an environment of high temperature (for example, 800° C. to 1000° C.) and high pressure (for example, several tens of atmospheric pressure) and a nitrogen gas ($N_2$) is dissolved in the melt. This can grow the GaN seed crystal in the crucible and manufacture the intended GaN crystal. The reaction condition in the manufacturing method of a III-V compound crystal according to the present invention may be the same condition as the above-described general sodium flux method or may be changed as appropriate, for example. For example, Ga may be replaced by another arbitrary group III element. Furthermore, the nitrogen gas may be replaced by another nitrogen-containing gas as described below.

If the crystal growth step is carried out under an atmosphere containing nitrogen in the above-described liquid phase growth method, the form of the nitrogen in the "atmosphere containing nitrogen" is not particularly limited and gas, nitrogen molecules, nitrogen compound, and so forth are cited, for example. It is preferable that the "atmosphere containing nitrogen" be a nitrogen-containing gas atmosphere. This is because the nitrogen-containing gas is dissolved in the flux to become a cultivation raw material of the III-V compound crystal. As the nitrogen-containing gas, another nitrogen-containing gas such as an ammonia gas ($NH_3$) may be used in addition to or instead of the above-described nitrogen gas ($N_2$). In the case of using a mixture gas of a nitrogen gas and an ammonia gas, the mixture ratio is arbitrary. In particular, using an ammonia gas is preferable because the reaction pressure can be reduced.

As the above-described alkali metal melt (flux), another alkali metal such as lithium may be used in addition to or instead of sodium. More concretely, the alkali metal melt contains at least one selected from a group consisting of lithium (Li), sodium (Na), potassium (K), rubidium (Rb), cesium (Cs), and francium (Fr) and may be mixed flux of Na and Li or the like, for example. It is particularly preferable for the alkali metal melt to be a sodium melt. Furthermore, the alkali metal melt may contain one kind or plural kinds of components other than the alkali metal or does not have to contain the components. As the components other than the alkali metal, alkaline earth metals are cited, for example, although the components are not particularly limited. As the alkaline earth metals, there are calcium (Ca), magnesium (Mg), strontium (Sr), barium (Br), and radium (Ra), for example. Among them, Ca and Mg are preferable and Ca is more preferable. Furthermore, as the component other than the alkali metal, for example, carbon (carbon elemental substance or carbon compound) may be contained or does not have to be contained. Carbon elemental substances and carbon compounds that generate cyanogen (CN) in the above-described melt are preferable. Furthermore, the carbon may be a gaseous organic. As such carbon elemental substances and carbon compounds, cyanide, graphite, diamond, fullerene, carbon nanotube, methane, ethane, propane, butane, benzene, and so forth are cited, for example. The content of the carbon is not particularly limited. On the basis of the total of the melt, the group III element, and the carbon, the content of the carbon is in a range of 0.01 to 20 atomic (at.) %, range of 0.05 to 15 atomic (at.) %, 0.1 to 10 atomic (at.) %, 0.1 to 5 atomic (at.) %, 0.25 to 7.5 atomic (at.) %, 0.25 to 5 atomic (at.) %, 0.5 to 5 atomic (at.) %, 0.5 to 2.5 atomic (at.) %, 0.5 to 2 atomic (at.) %, 0.5 to 1 atomic (at.) %, 1 to 5 atomic (at.) %, or 1 to 2 atomic (at.) %, for example. Among them, the content of the carbon may be in a range of 0.5 to 5 atomic (at.) %, 0.5 to 2.5 atomic (at.) %, 0.5 to 2 atomic (at.) %, 0.5 to 1 atomic (at.) %, 1 to 5 atomic (at.) %, or 1 to 2 atomic (at.) %, for example.

The addition rate of the alkali metal with respect to the group III element is not particularly limited and may be 0.1 to 99.9 mol %, 1 to 99 mol %, or 5 to 98 mol %, for example. Furthermore, the molar ratio in the case of using mixed flux of alkali metal and alkaline earth metal may be alkali metal:alkaline earth metal=99.99 to 0.01:0.01 to 99.99 or may be 99.9 to 0.05:0.1 to 99.95 or may be 99.5 to 1:0.5 to 99, for example. It is preferable that the purity of the above-described melt be high. For example, the purity of Na may be purity equal to or higher than 99.95%. As the flux component (for example, Na) with high purity, a commercially-available product with high purity may be used or a subject obtained by purchasing a commercially-available product and then raising the purity thereof by a method such as distillation may be used.

The temperature and pressure of the reaction between the group III element and the nitrogen-containing gas are also not limited to the above-described numerical values and may be set as appropriate. Although appropriate reaction temperature and pressure change depending on the component of the melt (flux), the atmosphere gas component, and the pressure thereof, the temperature may be 100 to 1500° C. and the pressure may be 100 Pa to 20 MPa, for example. Alternatively, the temperature may be 300° C. to 1200° C. and the pressure may be 0.01 to 20 MPa, or the temperature may be 500° C. to 1100° C. and the pressure may be 0.1 to 10 MPa, or the temperature may be 700° C. to 1100° C. and the pressure may be 0.1 to 10 MPa. Furthermore, the reaction time, i.e. the growth (cultivation) time of the crystal, is not particularly limited and can be set as appropriate to allow the crystal to grow to a proper size. For example, the reaction time may be 1 to 1000 hours, 5 to 600 hours, or 10 to 400 hours, for example.

In the above-described liquid phase growth method, possibly the above-described seed crystal is dissolved due to the above-described flux before the nitrogen concentration rises, depending on the case. To prevent this, a nitride may be made to exist in the flux at least at the initial stage of the reaction. As the nitride, there are $Ca_3N_2$, $Li_3N$, $NaN_3$, BN, $Si_3N_4$, InN, and so forth, for example. They may be used alone or two or more kinds of substances may be used in combination. Furthermore, the ratio of the nitride in the flux may be 0.0001 to 99 mol %, 0.001 to 50 mol %, or 0.005 to 10 mol %, for example.

In the liquid phase growth method, it is also possible to allow an impurity to exist in the above-described mixed flux. This can manufacture a GaN crystal containing the impurity. As the impurity, there are silicon (Si), alumina ($Al_2O_3$), indium (In), aluminum (Al), indium nitride (InN), silicon oxide ($SiO_2$), indium oxide ($In_2O_3$), zinc (Zn), magnesium (Mg), zinc oxide (ZnO), magnesium oxide (MgO), germanium (Ge), and so forth, for example.

In the liquid phase growth method, a stirring step of stirring the above-described melt may be further included. The stage at which the stirring step is carried out is not particularly limited. For example, the stirring step may be carried out at least one of before the crystal growth step, simultaneously with the crystal growth step, and after the crystal growth step. More concretely, for example, the stirring step may be carried out before the crystal growth step or may be carried out simultaneously with the crystal growth step. Alternatively, the stirring step may be carried out at both of these timings.

<1-4. Substrate Separation Step>

Moreover, as depicted in FIG. 1F and FIG. 1G, after the crystal growth step, the substrate 11 is separated from the III-V compound crystal 12 (substrate separation step).

First, after the crystal growth step, cooling is carried out to a room temperature in order to take out the III-V compound crystal 12 separated from the substrate 11 from the reaction furnace 1000. Thereupon, the III-V compound crystal 12 and the substrate 11 get distorted to bend due to difference in the coefficient of thermal expansion between the III-V compound crystal 12 and the substrate 11. For example, if the III-V compound crystal 12 is gallium nitride (GaN) and the substrate 11 is sapphire, the coefficient of thermal expansion of sapphire is smaller compared with gallium nitride as described above. Therefore, due to the cooling, the sapphire substrate 11 bends in such a manner that the side of the gallium nitride 12 becomes a convex shape as depicted in FIG. 1F. This generates stress in the III-V compound crystal 12 and the substrate 11. Furthermore, because part of the III-V compound seed crystal layer 12a has been separated from the substrate 11 by the seed crystal partial separation step, it has become easy for the substrate 11 to be peeled off (separated) from the III-V compound seed crystal layer 12a and the III-V compound crystal 12. Thus, as depicted in FIG. 1G, the substrate 11 is peeled off (separated) from the III-V compound seed crystal layer 12a and the III-V compound crystal 12 due to the above-described stress. Thereafter, the III-V compound crystal 12 separated from the substrate 11 is taken out from the crystal growth furnace 1000. In the above-described manner, the III-V compound crystal 12 can be manufactured.

In the present embodiment, for example, immediately after the III-V compound seed crystal layer 12a is formed as depicted in FIG. 1B, the thickness of the III-V compound seed crystal layer (buffer layer) 12a is thin (thin film). For this reason, warpage (bending) has not occurred in the substrate 11 and the III-V compound seed crystal layer 12a in this state. Therefore, the position at which a laser beam is focused (processing position) is easily adjusted and it is easy to carry out the seed crystal partial separation step as depicted in FIG. 1C and FIG. 1D. Moreover, as described above, because part of the III-V compound seed crystal layer 12a has been separated from the substrate 11 by the seed crystal partial separation step, it has become easy for the substrate 11 to be peeled off (separated) from the III-V compound seed crystal layer 12a and the III-V compound crystal 12. For this reason, without applying a force to peel off the substrate 11 from the external, the substrate 11 can be peeled off (separated) from the III-V compound seed crystal layer 12a and the III-V compound crystal 12 by only the stress generated in the III-V compound crystal 12 and the substrate 11 at the time of cooling as described above.

In a general manufacturing method of a III-V compound crystal, a force (external force) needs to be applied from the external to separate the substrate from the III-V compound crystal after the III-V compound crystal is manufactured. In contrast, according to the present invention, it is also possible to separate the substrate from the III-V compound crystal by only stress at the time of cooling without applying an external force as described above, for example. That is, in the present invention, without separately (intentionally) carrying out the substrate separation step, the cooling step after the III-V compound crystal manufacturing step can be made to double as the substrate separation step. However, the present invention is not limited thereto. For example, separately the substrate separation step may be carried out by applying a force (external force) from the external to separate the substrate from the III-V compound crystal. In the present invention, because part of the III-V compound seed crystal has been separated from the substrate by the seed crystal partial separation step, the substrate is easily separated even with a small force after the III-V compound crystal growth step. For this reason, breakage or the like of the manufactured III-V compound crystal occurs less readily.

It has become possible to manufacture a semiconductor crystal with a large size due to advancement of techniques in recent years, and the design of semiconductor device has become more various due to this. For example, in a silicon semiconductor substrate and so forth, large-size crystals with a diameter of 6 inches (approximately 15 cm), 8 inches (approximately 20 cm), 12 inches (approximately 30 cm), 18 inches (approximately 45 cm), or the like have been put into practical use or studies are being made on the practical use. However, manufacturing of crystals with such a large size is difficult in III-V compound crystals of GaN and so forth. As a cause thereof, that distortion easily occurs in the III-V compound crystal due to difference in the coefficient of thermal expansion from the substrate is cited as described above. Furthermore, in the case of a crystal with a particularly-large size, the crystal easily breaks when a force is applied to separate the crystal from the substrate. However, according to the present invention, the substrate is easily separated even with a small force and breakage or the like of the manufactured III-V compound crystal occurs less readily as described above, for example. Furthermore, for example, as described above, it is also possible to make the cooling step after the III-V compound crystal manufacturing step to double as the substrate separation step without separately (intentionally) carrying out the substrate separation step.

<2. III-V Compound Crystal, Semiconductor Device, Manufacturing Method of Semiconductor Device>

The III-V compound crystal manufactured by the above-described III-V compound crystal manufacturing method of the present invention is not particularly limited and is as described above, for example. The dislocation density of the III-V compound crystal is not particularly limited. However, it is preferable that the dislocation density be low, and the dislocation density is $1 \times 10^8$ cm$^{-2}$ or lower, $1 \times 10^7$ cm$^{-2}$ or lower, $1 \times 10^6$ cm$^{-2}$ or lower, or $1 \times 10^5$ cm$^{-2}$ or lower, for example. The lower-limit value of the dislocation density is not particularly limited. However, ideally the lower-limit value is 0 or a value equal to or smaller than the measurement limit value of measurement equipment. The value of the dislocation density may be an average of the whole crystal, for example. However, it is more preferable that the maximum value in the crystal be equal to or smaller than the above-described value. Furthermore, in the group III nitride crystal of the present invention, the half widths of a symmetric reflection component (002) and an asymmetric reflection component (102) as half widths by XRC (X-ray rocking curve diffraction method) are not particularly limited and are each 100 seconds or shorter, for example, and are preferably 30 seconds or shorter. The lower-limit value of the measurement value of the XRC half width is not particularly limited. However, ideally the lower-limit value is 0 or a value equal to or smaller than the measurement limit value of measurement equipment.

Furthermore, the use purpose of the group III nitride crystal manufactured by the III-V compound crystal manufacturing method of the present invention is not particularly limited. For example, the group III nitride crystal can be used for semiconductor device because having properties as a semiconductor. A manufacturing method of semiconductor device according to the present invention is characterized by including a step of manufacturing the above-described III-V compound crystal by the above-described manufacturing method of a III-V compound crystal according to the present invention as described above. Besides this, the manufacturing method of semiconductor device according to the present invention is not particularly limited and may include any step.

The group III nitride crystal manufactured by the III-V compound crystal manufacturing method of the present invention can provide semiconductor device with extremely-high performance due to having a large size, fewer defects such as warpage (distortion), and high quality, for example. Furthermore, according to the present invention, it is also possible to provide a III-V compound (for example, GaN) crystal with a 6-inch diameter or larger, which is impossible with related arts, as described above, for example. Due to this, for example, further enhancement in the performance is also enabled by using the III-V compound instead of Si (silicon) in semiconductor device such as power device and LED, regarding which increase in the wafer diameter of Si has become a standard. The impact given to the semiconductor industry by the present invention based on this is extremely large.

Furthermore, the semiconductor device manufactured by the manufacturing method of semiconductor device according to the present invention is not particularly limited and may be any as long as it is an article that operates using a semiconductor. As the article that operates using a semiconductor, semiconductor element, inverter, electrical equipment using the semiconductor element, the inverter, and so forth, and so forth are cited, for example. For example, the semiconductor device of the present invention may be various kinds of electrical equipment such as mobile phone, liquid crystal television, illumination equipment, power device, laser diode, solar cell, high-frequency device, and display or may be semiconductor element, inverter, and so forth used for them. The semiconductor element is not particularly limited and LD, LED, and so forth are cited, for example. For example, a LD that emits blue light is applied to high-density optical disc, display, and so forth and a LED that emits blue light is applied to display, illumination, and so forth. Furthermore, an ultraviolet LD is expected to be applied to biotechnology and so forth and an ultraviolet LED is expected as an ultraviolet source as a substitute for a mercury lamp. In addition, an inverter for which the III-V compound of the present invention is used as a power semiconductor for an inverter can also be used for power generation of a solar cell or the like, for example. Moreover, as described above, the III-V compound crystal manufactured by the III-V compound crystal manufacturing method of the present invention is not limited to them and can be applied to other arbitrary semiconductor device or other wide-range technical fields.

WORKING EXAMPLE

Next, a working example of the present invention will be described. However, the present invention is not limited by the following working example.

In the following working example and reference example, for all of manufacturing (cultivation) of a crystal by a liquid phase growth method, LPE apparatus with a structure depicted in schematic diagrams of FIG. 7A and FIG. 7B was used. As depicted in FIG. 7A, this LPE apparatus includes a raw material gas tank 361 for supplying a raw material gas (in the present working example, nitrogen gas), a pressure adjuster 362 for adjusting the pressure of a cultivation atmosphere, a leak valve 363, a stainless steel container 364 for carrying out crystal cultivation, and an electric furnace 365. FIG. 7B is a diagram in which the stainless steel container 364 is enlarged, and a crucible 366 is set inside the stainless steel container 364. In the present working example, as the crucible, a crucible made of aluminum oxide ($Al_2O_3$) was used for all manufacturing. Furthermore, in the present working example, Ga:Na represents the substance amount ratio (molar ratio) between gallium and sodium used. In addition, as apparatus for laser beam irradiation, DFL 7560 (trade name) made by DISCO Corporation was used for all manufacturing.

WORKING EXAMPLE 1

First, a seed-crystal-formed substrate (made by POWDEC K. K., trade name GaN epi-wafer 150-5-1000) in which a GaN layer with a thickness of approximately 5 μm was stacked on a sapphire substrate (φ150 mm) with a thickness of approximately 1000 μm was prepared (seed-crystal-formed substrate provision step). Next, laser beam irradiation was carried out from the sapphire substrate side of this seed-crystal-formed substrate under a condition described in the following Table 1, and part of the portion in contact with the sapphire substrate in the GaN layer was separated from the sapphire substrate (seed crystal partial separation step). The size and shape of the part that was processed by the laser beam irradiation and was separated from the sapphire substrate and the part that was not processed but left in the GaN layer will be described later.

TABLE 1

| | |
|---|---|
| Light source: | YAG laser |
| Wavelength: | 257.5 nm |
| Repetition frequency: | 50 to 200 kHz |
| Average output power: | 0.4 to 1.0 W |
| Pulse width: | 100 ps |
| Pulse energy: | 8 to 5 μJ |
| Spot diameter: | 50 μm |
| Laser irradiator movement speed: | 50 to 100 mm/second |

Next, with use of this seed-crystal-formed substrate, crystal growth (cultivation) was carried out and a GaN crystal was manufactured under a nitrogen gas atmosphere under a condition of the following Table 2. "C [mol %] 0.5" described below indicates that carbon powders were added by 0.5 mol % with respect to the total of the substance amounts of gallium (Ga), sodium (Na), and the carbon powders. As handling, first the crucible 366 in which gallium (Ga), sodium (Na), carbon powders (C), and the seed-crystal-formed substrate were put was put in the stainless steel container 364, and the stainless steel container 364 was put in the electric furnace (heat-resistant, pressure-resistant container) 365. Next, simultaneously with introducing a nitrogen gas from the raw material gas tank 361 into the stainless steel container 364, the inside of the electric furnace (heat-resistant, pressure-resistant container) 365 was heated by a heater (not depicted). Then, under a high-temperature, high-pressure condition described in the following Table 2, a reaction was caused for 72 hours to carry out the crystal growth (cultivation), so that the intended GaN crystal was manufactured. Then, when cooling (allowing to cool) to a room temperature was carried out in order to take out the manufactured GaN crystal from the electric furnace (heat-resistant, pressure-resistant container) 365, the sapphire substrate was peeled off from the manufactured GaN crystal. Moreover, a GaN crystal was manufactured several times under the same condition.

TABLE 2

| Temperature [° C.] | 870 |
| Pressure [MPa] | 4.0 |
| Time [hour] | 72 |
| Ga:Na | 27:73 |
| C [mol %] | 0.5 |
| Liquid level [cm] | 0.8 |
| Crucible | $Al_2O_3$ |
| Seed crystal (GaN) film thickness [μm] | 5 |

In FIG. 8, photographs of the GaN crystal manufactured in the present working example and the sapphire substrate after it was used for the manufacturing of the GaN crystal in the present working example are depicted. The photograph on the left side of FIG. 8 is the GaN crystal and the photograph on the right side is the sapphire substrate. As depicted in the diagram, the manufactured GaN crystal was separated from the sapphire substrate without breaking or being left on the sapphire substrate.

In the present working example, as described above, the sapphire substrate was peeled off from the manufactured GaN crystal when cooling (allowing to cool) to a room temperature was carried out in order to take out the manufactured GaN crystal from the electric furnace (heat-resistant, pressure-resistant container) 365. As above, in the present working example, the cooling step after the GaN crystal manufacturing step could be made to double as the substrate separation step without applying an external force to the sapphire substrate and the manufactured GaN crystal. Moreover, as depicted in the photographs of FIG. 8, the manufactured GaN crystal could be separated from the sapphire substrate without breaking or being left on the sapphire substrate.

In FIG. 9A to FIG. 9F, the outline of the seed-crystal-formed substrate used in the present working example (after processing by the laser beam) is depicted.

Figure 9C:
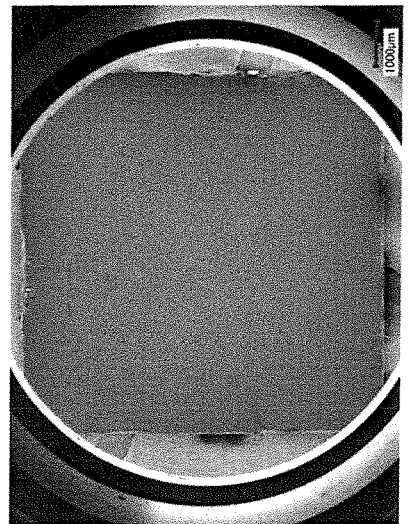
FIG. 9A to FIG. 9F are diagrams depicting the structure of a seed-crystal-formed substrate used in the working example.
Figure 9F:
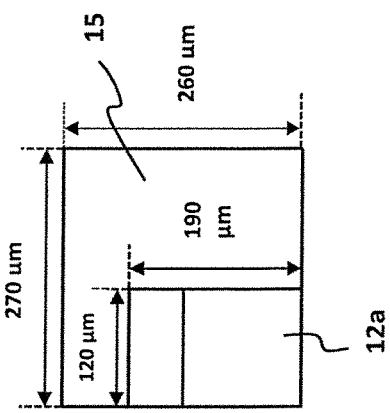
Figure 9A:
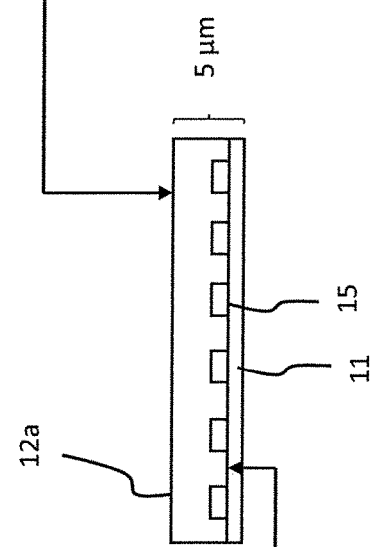

FIG. 9A is a sectional view schematically depicting the structure of the seed-crystal-formed substrate. As depicted in the diagram, at the part subjected to the laser beam processing in the portion in contact with the sapphire substrate 11 in the GaN seed crystal layer 12a, the processing mark 15 was formed and the GaN seed crystal layer 12a was separated from the sapphire substrate 11. It is inferred that GaN changed to metallic gallium by the laser beam irradiation at the part of the processing mark 15.

Figure 9E:
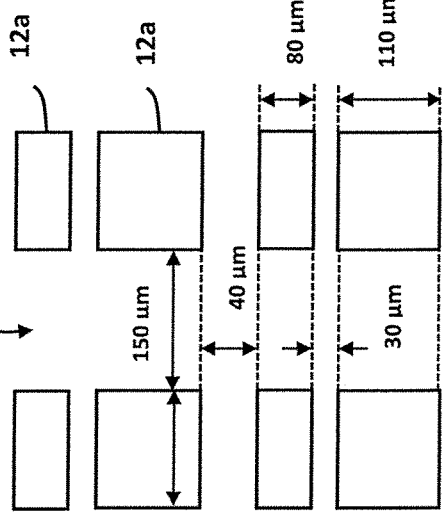
Figure 9B:
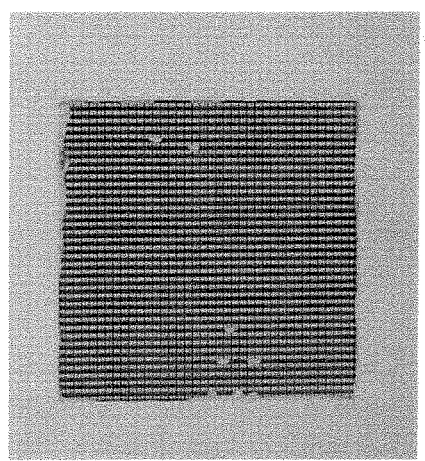

FIG. 9B is a plan photograph of the seed-crystal-formed substrate. As depicted in the diagram, in the GaN seed crystal layer 12a, the part of the processing mark 15 resulting from the laser beam processing and the part that was not processed but left were observed in such a manner as to be clearly separated.

FIG. 9C is a scanning electron microscope (SEM) image obtained when the seed-crystal-formed substrate was observed through the surface on the side of the GaN seed crystal layer 12a (on the opposite side to the sapphire substrate 11). As depicted in the diagram, it was confirmed that the GaN seed crystal layer 12a was left without changing in the surface on the opposite side to the sapphire substrate 11.

Figure 9D:
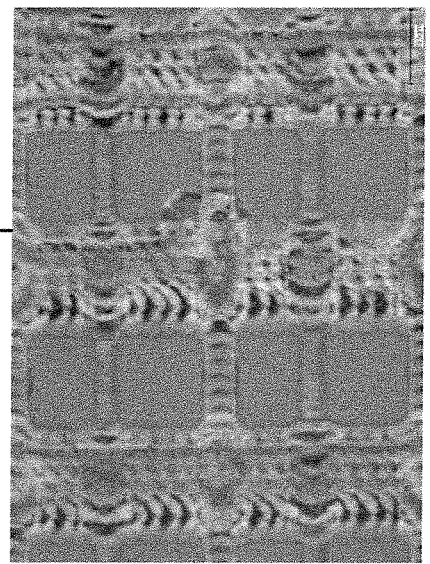

FIG. 9D is an optical microscope image obtained when the seed-crystal-formed substrate was observed through the surface on the side of the sapphire substrate 11. As depicted in the diagram, in the GaN seed crystal layer 12a, the part of the processing mark 15 resulting from the laser beam processing and the part that was not processed but left were observed in such a manner as to be clearly separated.

FIG. 9E is a plan view schematically depicting the size and shape of the part of the processing mark 15 resulting from the laser beam processing and the part that was not processed but left in the GaN seed crystal layer 12a. As depicted in the diagram, at the part that was not processed but left, one rectangle of horizontal 120 μm×vertical 110 μm and one rectangle of horizontal 120 μm×vertical 80 μm are disposed at an interval of 30 μm in the vertical direction to form a unit. Furthermore, a large number of units are disposed at intervals of 40 μm in the vertical direction and 150 μm in the horizontal direction.

FIG. 9F is a plan view schematically depicting the area ratio of the part that was not subjected to the laser beam processing but left with respect to the whole in the GaN seed crystal layer 12a. As depicted in the diagram, from the vertical and horizontal dimensions of the part of the processing mark 15 resulting from the laser beam processing and the part that was not processed but left, the area of the part that was not processed but left is calculated as approximately 32.5% of the whole.

FIG. 10A to FIG. 10D depict a photoluminescence (PL) measurement result of the seed-crystal-formed substrate of FIG. 9.

Figure 10A:
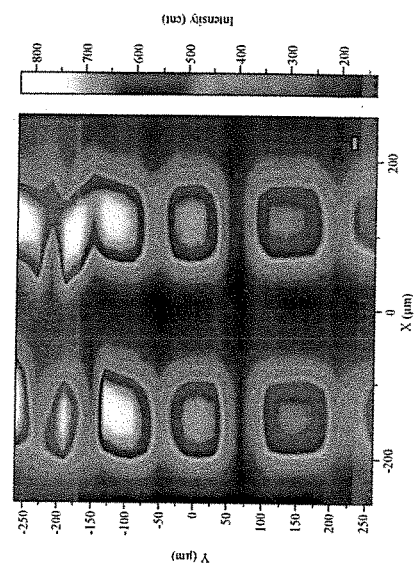
FIG. 10A to FIG. 10D are diagrams depicting a photoluminescence (PL) measurement result of the seed-crystal-formed substrate of FIG. 9A.
Figure 10B:
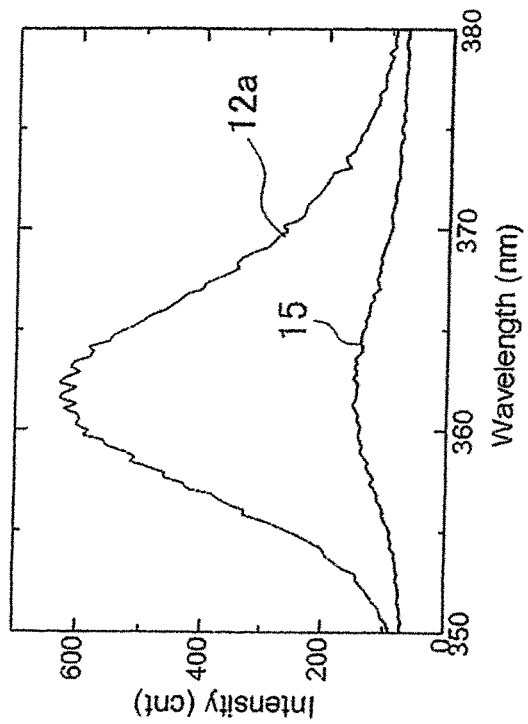

FIG. 10A is a PL image obtained when the seed-crystal-formed substrate was observed through the surface on the side of the GaN seed crystal layer 12a (on the opposite side to the sapphire substrate 11). FIG. 10B is a graph depicting the analysis result of the PL image of FIG. 10A. In FIG. 10B, the abscissa axis represents the wavelength [nm] and the ordinate axis represents the relative intensity [cnt]. As depicted in the diagram, it was confirmed that the GaN seed crystal layer 12a was left without changing in the surface on the opposite side to the sapphire substrate 11.

Figure 10C:
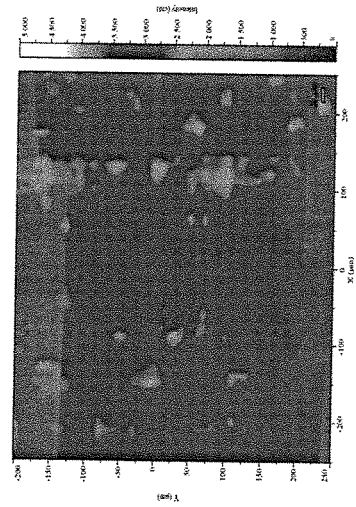
Figure 10D:
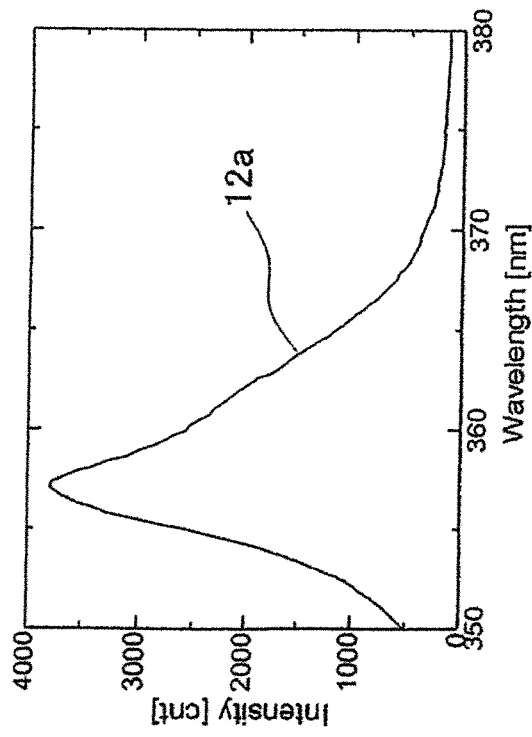

Furthermore, FIG. 10C is a PL image obtained when the seed-crystal-formed substrate was observed through the surface on the side of the sapphire substrate 11. FIG. 10D is a graph depicting the analysis result of the PL image of FIG. 10C. In FIG. 10D, the abscissa axis represents the wavelength [nm] and the ordinate axis represents the relative intensity [cnt]. As depicted in the diagram, in the GaN seed crystal layer 12a, the part of the processing mark 15 resulting from the laser beam processing and the part that was not processed but left were observed in such a manner as to be clearly separated.

Figure 11C:
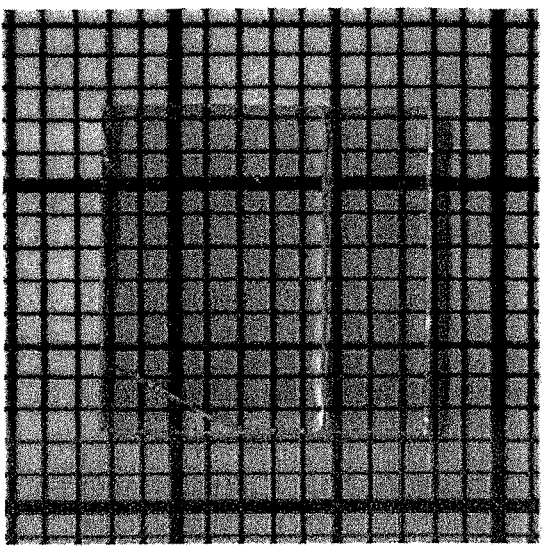
FIG. 11A to FIG. 11C are photographs of another GaN crystal manufactured in the working example and a sapphire substrate peeled off from the GaN crystal.
Figure 11B:
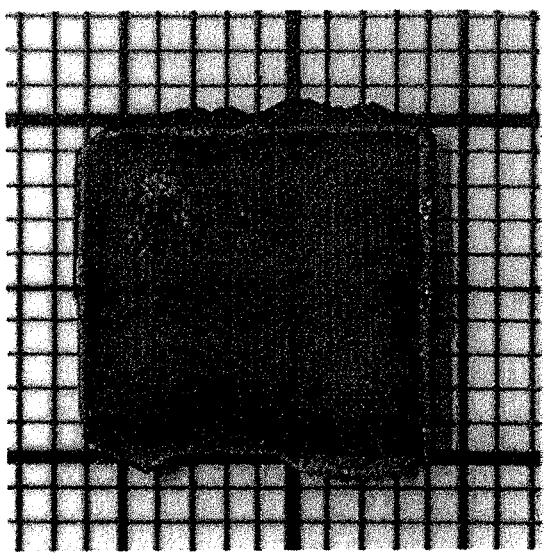
Figure 11A:
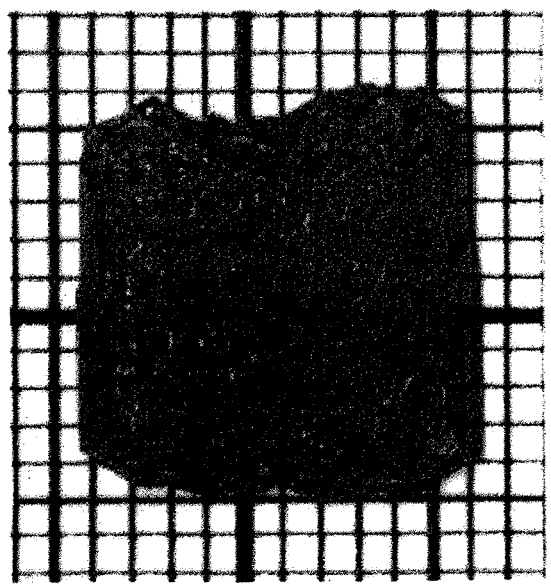

In FIG. 11A to FIG. 11C, photographs of a GaN crystal that was manufactured by the present working example and is different from FIG. 8 and a sapphire substrate after it was used for the manufacturing of the GaN crystal are depicted. FIG. 11A is a photograph of the front surface of the GaN crystal (surface on the opposite side to the side that was in contact with the sapphire substrate). FIG. 11B is a photograph of the back surface of the GaN crystal (surface on the side that was in contact with the sapphire substrate). FIG. 11C is a photograph of the sapphire substrate. As depicted in the diagram, the manufactured GaN crystal was separated from the sapphire substrate without breaking or being left on the sapphire substrate. Furthermore, as described above, the cooling step after the GaN crystal manufacturing step could be made to double as the substrate separation step without applying an external force to the sapphire substrate and the manufactured GaN crystal.

REFERENCE EXAMPLE

A GaN crystal was manufactured in the same manner as the working example except that processing by laser beam irradiation (seed crystal partial separation step) was not carried out for the above-described seed-crystal-formed substrate and the seed-crystal-formed substrate was subjected to the crystal growth step directly.

Figure 12:
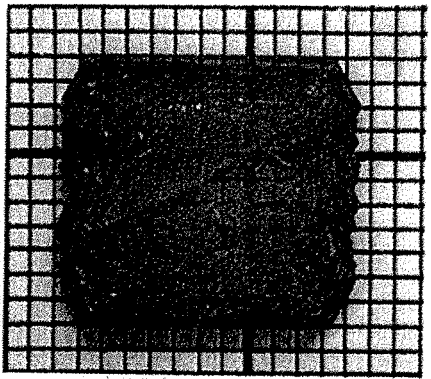
FIG. 12 is a diagram in which photographs of the same GaN crystal as FIG. 11 are depicted in conjunction with photographs of a GaN crystal of a comparative example.
Figure 12:
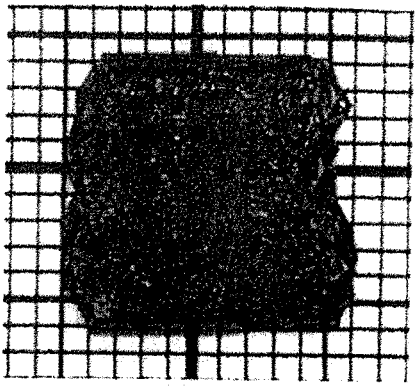
Figure 12:
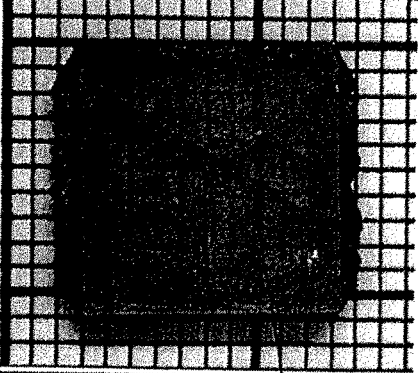
Figure 12:
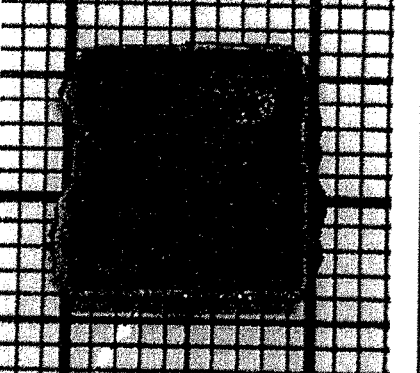

In FIG. 12, photographs of the GaN crystals of the reference example (Ref.) and the working example (LAS pattern processing) are depicted. In the present working example, "LAS" is an abbreviation of Laser Assist Separation. Furthermore, the yield (%) and the film thickness (mm) of each GaN crystal are also depicted in conjunction with the photographs. The left side of FIG. 12 is the reference example (Ref.) and the right side is the working example (LAS pattern processing). In each example, the photograph on the upper side is a photograph of the front surface of the GaN crystal (surface on the opposite side to the sapphire substrate) and the photograph on the lower side is a photograph of the back surface of the GaN crystal (surface on the sapphire substrate side). The yield (%) was calculated based on the weight of the metallic gallium used and the weight of the manufactured GaN crystal. Furthermore, the GaN crystal of the photographs on the right side of FIG. 12 is the same GaN crystal as the photographs of FIG. 11.

As depicted in FIG. 12, in the GaN crystal of the reference example, although the yield was slightly higher than the working example, the sapphire substrate was not peeled off from the GaN crystal but left even when cooling was carried out after the GaN crystal manufacturing step, differently from the working example. Furthermore, in the reference example, a crack was generated in the sapphire substrate.

Figure 13A:
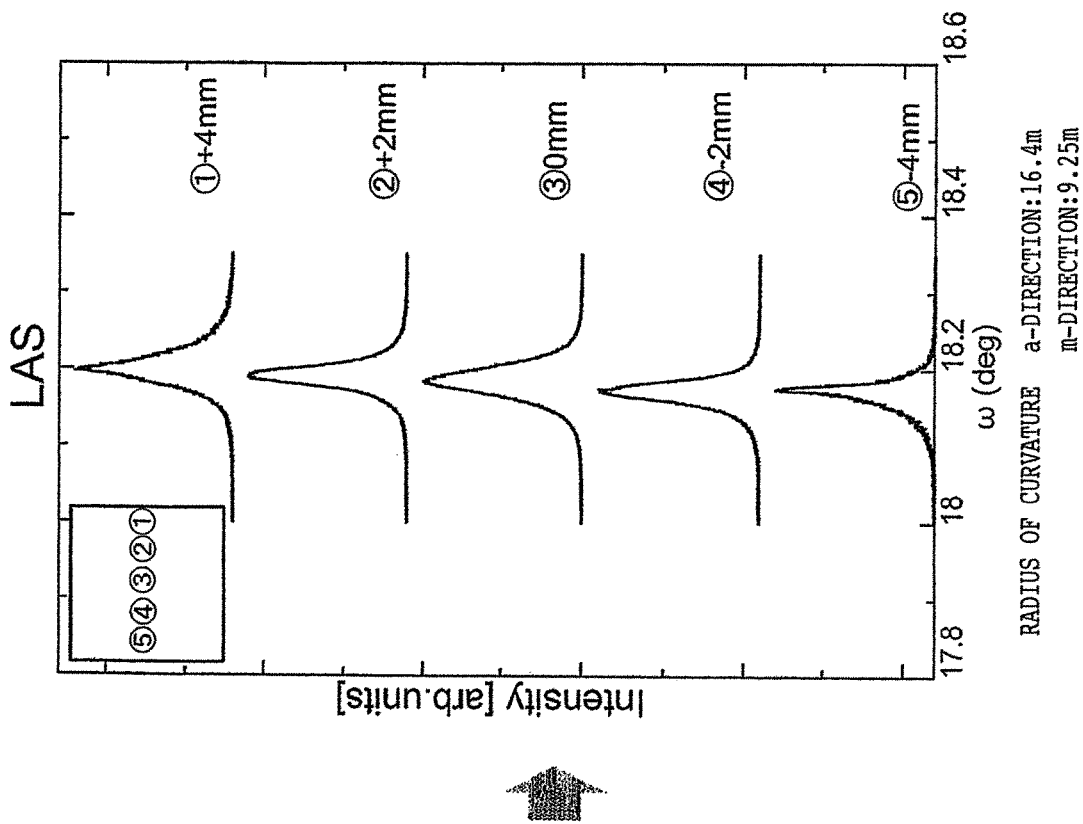
FIG. 13A is a graph depicting an XRC (X-ray rocking curve diffraction method) measurement result of the GaN crystal of the comparative example depicted in FIG. 12.
Figure 13B:
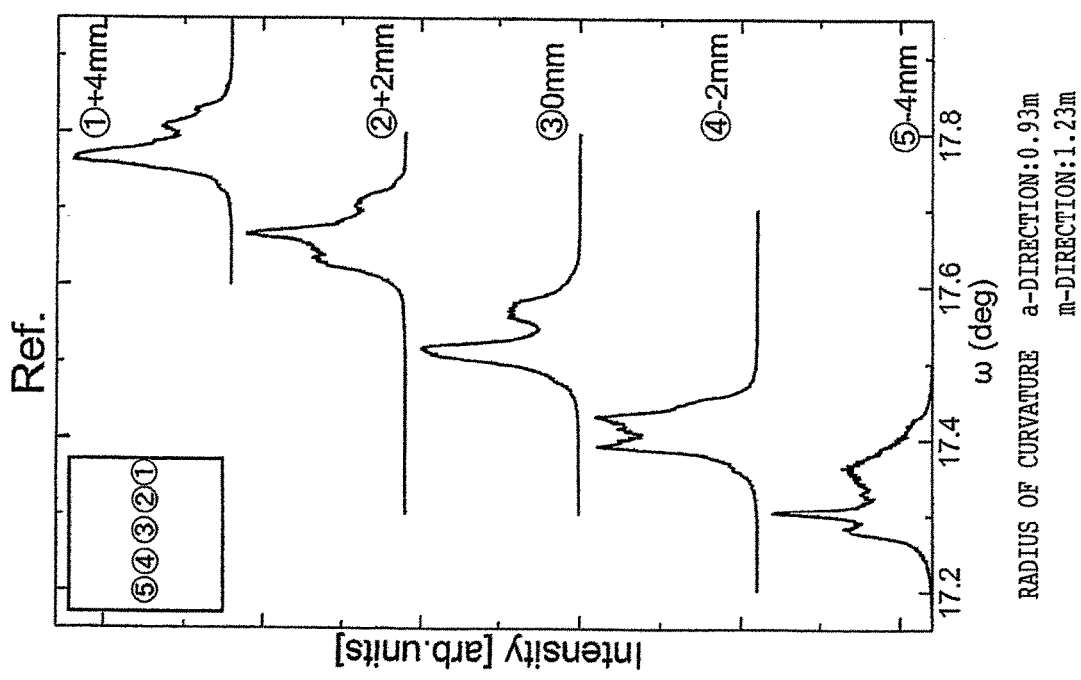
FIG. 13B is a graph depicting an XRC (X-ray rocking curve diffraction method) measurement result of the GaN crystal of the working example depicted in FIG. 12.

In graphs of FIG. 13A and FIG. 13B, co-scan measurement results of XRC (X-ray rocking curve diffraction method) of the GaN crystals of the working example and the reference example depicted in FIG. 12 are depicted. FIG. 13A is a graph depicting the measurement result of the XRC (X-ray rocking curve diffraction method) of the GaN crystal of the reference example (Ref.). FIG. 13B is a graph depicting the measurement result of the XRC (X-ray rocking curve diffraction method) of the same GaN crystal as FIG. 11 and FIG. 12 in the working example. In each of FIG. 13A and FIG. 13B, the abscissa axis represents the measurement angle ω (deg) and the ordinate axis represents the relative intensity. As depicted in the diagram, in each GaN crystal, the same measurement was carried out regarding five places at intervals of 2 mm. As a result, as depicted in the diagram, in the GaN crystal of the reference example, variation in the measurement result at the respective measurement places was large. In contrast, in the GaN crystal of the working example, variation in the measurement result at the respective measurement places was extremely small. Furthermore, the radius of curvature of each GaN crystal was calculated from these measurement results. As a result, in the GaN crystal of the reference example, the radius of curvature was 0.98 m in the a-direction and 1.23 m in the m-direction. In contrast, in the GaN crystal of the working example, the radius of curvature was 16.4 m in the a-direction and 9.25 m in the m-direction. That is, it was confirmed that, in the GaN crystal of the working example, warpage (distortion) greatly decreased because the radius of curvature was extremely larger compared with the GaN crystal of the reference example.

Figure 14A:
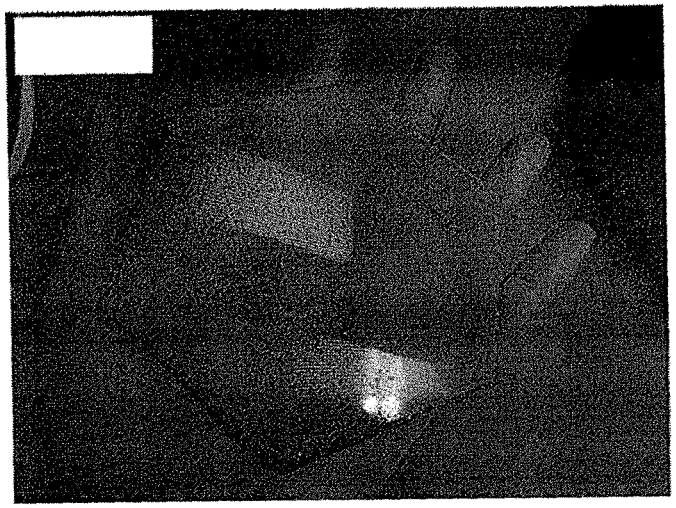
FIG. 14A to FIG. 14D are photographs of further other GaN crystals manufactured in the working example.
Figure 14B:
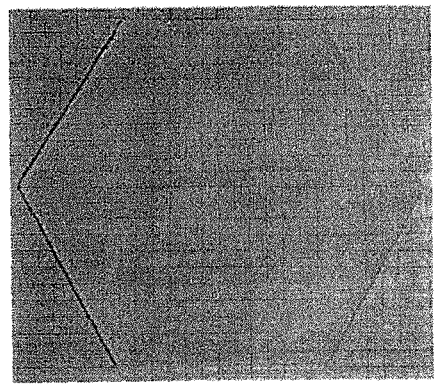
Figure 14C:
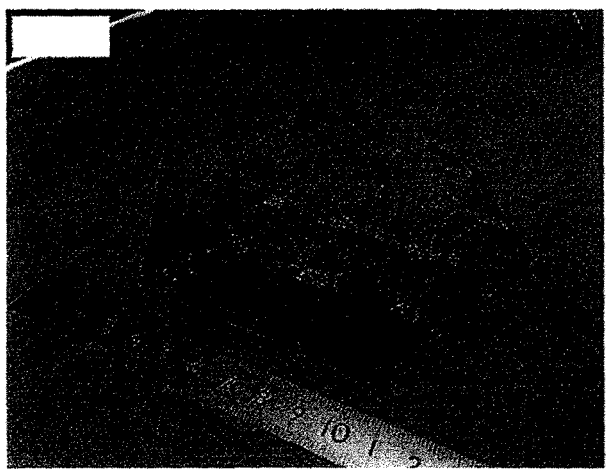
Figure 14D:
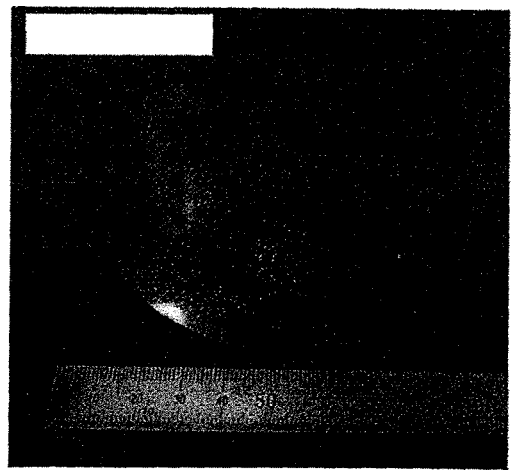

Furthermore, in FIG. 14A to FIG. 14D, photographs of further other GaN crystals manufactured in the working example are depicted. FIG. 14A is a photograph of the GaN crystal with an outer diameter of 4 inches. FIG. 14B is a photograph of a sapphire substrate peeled off from the GaN crystal of FIG. 14A after cooling. FIG. 14C is a photograph of the GaN crystal with an outer diameter of 6 inches. FIG. 14D is a photograph after polishing of the GaN crystal of FIG. 14C. As depicted in the diagram, the manufactured GaN crystals were separated from the sapphire substrate without breaking or being left on the sapphire substrate. Furthermore, as described above, the cooling step after the GaN crystal manufacturing step could be made to double as the substrate separation step without applying an external force to the sapphire substrate and the manufactured GaN crystal. Moreover, according to the present working example, a GaN crystal having a large size with a diameter of 4 inches, 6 inches or the like and having high quality could be manufactured as depicted in the photographs of FIG. 14.

As described above, according to the present invention, it is possible to provide a manufacturing method of a III-V compound crystal and a manufacturing method of semiconductor device in each of which it is easy to separate (peel off) a III-V compound crystal from a substrate. III-V compound crystal and semiconductor device manufactured by the manufacturing method of a III-V compound crystal and the manufacturing method of semiconductor device according to the present invention can be used for various use purposes as described above. Moreover, they are not limited thereto and can be applied to arbitrary semiconductor device or other wide-range technical fields.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A manufacturing method of a III-V compound crystal, the manufacturing method comprising:

a seed-crystal-formed substrate provision step of providing a seed-crystal-formed substrate in which a III-V compound seed crystal has been formed on a substrate;

a seed crystal partial separation step of separating a part of a portion of the III-V compound seed crystal from the substrate, wherein a portion of the III-V compound seed crystal in contact with the substrate is separated by irradiating the III-V compound seed crystal with a laser beam from a side of the substrate so that portions of the substrate not irradiated with the laser beam are left in contact with the substrate and are dot-shaped;

a crystal growth step of generating and growing a III-V compound crystal on the III-V compound seed crystal by reacting a group III element and a group V element with use of the III-V compound seed crystal as a nucleus after the seed crystal partial separation step; and a substrate separation step of separating the substrate from the III-V compound crystal after the crystal growth step by cooling the substrate and the III-V compound crystal, wherein the substrate is separated from the III-V compound crystal based on difference in an expansion rate or a contraction rate between the III-V compound crystal and the substrate due to a decrease in temperature in the substrate separation step.

2. The manufacturing method according to claim 1, further comprising:
a contact step of bringing a surface of the III-V compound seed crystal on an opposite side to the substrate into contact with a metallic melt after the seed crystal partial separation step,
wherein the group III element and the group V element are reacted in the metallic melt in the crystal growth step.

3. The manufacturing method according to claim 2,
wherein the group V element is nitrogen,
the metallic melt is an alkali metal melt,
a III-V compound is a group III nitride, and
a group III nitride crystal is generated and grown with use of the III-V compound seed crystal as a nucleus by reacting the group III element and the nitrogen in the alkali metal melt under an atmosphere containing nitrogen in the crystal growth step.

4. The manufacturing method according to claim 1, wherein the group III element and the group V element are reacted in a vapor phase in the crystal growth step.

5. The manufacturing method according to claim 1, wherein the III-V compound seed crystal and the III-V compound crystal are gallium nitride.

6. The manufacturing method according to claim 1, wherein the substrate is a sapphire substrate.

7. The manufacturing method according to claim 1, wherein the group III element and the group V element are reacted in a liquid phase in the crystal growth step.

8. The manufacturing method according to claim 1, wherein substrate separation step includes bending the substrate such that a side of the III-V compound crystal forms a convex shape.

9. The manufacturing method according to claim 1, wherein the substrate separation step includes cooling the substrate and the III-V compound crystal to room temperature.

10. The manufacturing method according to claim 1, wherein the III-V compound crystal has a thickness of 0.001 mm to 1000 mm.

11. The manufacturing method according to claim 1, wherein the dot-shaped portions each have a circle shape or ellipse shape with a diameter of 100 mm or smaller.

12. A manufacturing method of semiconductor device including a III-V compound crystal, the manufacturing method comprising:
a seed-crystal-formed substrate provision step of providing a seed-crystal-formed substrate in which a III-V compound seed crystal has been formed on a substrate;
a seed crystal partial separation step of separating a portion of the III-V compound seed crystal from the substrate, wherein a part of the portion of the III-V compound seed crystal in contact with the substrate is separated by irradiating the III-V compound seed crystal with a laser beam from a side of the substrate so that portions of the substrate not irradiated with the laser beam are left in contact with the substrate and are dot-shaped;
a crystal growth step of generating and growing the III-V compound crystal by reacting a group III element and a group V element with use of the III-V compound seed crystal as a nucleus after the seed crystal partial separation step; and
a substrate separation step of separating the substrate from the III-V compound crystal after the crystal growth step by cooling the substrate and the III-V compound crystal,
wherein the substrate is separated from the III-V compound crystal based on difference in an expansion rate or a contraction rate between the III-V compound crystal and the substrate due to a decrease in temperature in the substrate separation step.

13. The manufacturing method according to claim 12, wherein the group III element and the group V element are reacted in a vapor phase in the crystal growth step.

14. The manufacturing method according to claim 12, wherein the group III element and the group V element are reacted in a liquid phase in the crystal growth step.

15. The manufacturing method according to claim 12, wherein substrate separation step includes bending the substrate such that a side of the III-V compound crystal forms a convex shape.

16. The manufacturing method according to claim 12, wherein the substrate separation step includes cooling the substrate and the III-V compound crystal to room temperature.

17. The manufacturing method according to claim 12, wherein the dot-shaped portions each have a circle shape or ellipse shape with a diameter of 100 mm or smaller.

* * * * *